(12) United States Patent
Jones et al.

(10) Patent No.: US 7,245,540 B2
(45) Date of Patent: Jul. 17, 2007

(54) CONTROLLER FOR DELAY LOCKED LOOP CIRCUITS

(75) Inventors: William Jones, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 09/874,898

(22) Filed: Jun. 5, 2001

(65) Prior Publication Data

US 2002/0181297 A1 Dec. 5, 2002

(51) Int. Cl.
*G11C 7/00* (2006.01)

(52) U.S. Cl. ........................... 365/197; 365/233

(58) Field of Classification Search ................. 365/194, 365/189.11, 241, 233, 189.12, 189.04, 222, 365/230.02
See application file for complete search history.

(56) References Cited

U.S. PATENT DOCUMENTS

| | | | | |
|---|---|---|---|---|
| 5,675,274 A | | 10/1997 | Kobayashi et al. ......... 327/158 |
| 5,940,344 A | * | 8/1999 | Murai et al. ................. 365/233 |
| 5,956,290 A | * | 9/1999 | Matsuzaki ................... 365/233 |
| 6,104,223 A | * | 8/2000 | Chapman et al. ........... 327/276 |
| 6,108,793 A | | 8/2000 | Fujii et al. .................. 713/400 |
| 6,122,190 A | | 9/2000 | Ooishi ......................... 365/149 |
| 6,147,927 A | * | 11/2000 | Ooishi ......................... 365/233 |
| 6,229,363 B1 | * | 5/2001 | Eto et al. ..................... 327/158 |
| 6,265,903 B1 | * | 7/2001 | Takahashi ....................... 327/7 |
| 6,288,585 B1 | * | 9/2001 | Bando et al. ................ 327/111 |
| 6,346,843 B2 | * | 2/2002 | Takahashi ................... 327/278 |
| 6,385,125 B1 | | 5/2002 | Ooishi et al. ............... 365/233 |
| 6,385,129 B1 | * | 5/2002 | Silvestri ..................... 365/233 |
| 6,388,485 B2 | | 5/2002 | Kim ........................... 327/161 |
| 6,404,250 B1 | | 6/2002 | Volrath et al. .............. 327/160 |
| 6,433,607 B2 | * | 8/2002 | Kawasaki et al. .......... 365/233 |
| 6,445,234 B1 | | 9/2002 | Yoon et al. .................. 327/161 |
| 6,480,439 B2 | * | 11/2002 | Tokutome et al. .......... 365/233 |
| 6,486,651 B1 | * | 11/2002 | Lee et al. ................. 324/76.53 |
| 6,510,503 B2 | | 1/2003 | Gillingham et al. ........ 711/167 |
| 6,809,974 B2 | | 10/2004 | Jones et al. ................. 365/201 |
| 2002/0051404 A1 | * | 5/2002 | Ooishi et al. ............... 365/233 |

\* cited by examiner

*Primary Examiner*—Thong Q. Le
(74) *Attorney, Agent, or Firm*—Schwegman, Lundberg, Woessner & Kluth, P.A.

(57) ABSTRACT

A method of controlling a delay locked loop (DLL) in a memory device is provided. The DLL generates an internal clock signal based on an external clock signal. The DLL constantly responds to variations in operating condition of the memory device to keep the external and internal clock synchronized. The method involves preventing the DLL from responding to a change in operating condition such as a change in the supply voltage of the memory device during an operational mode of the memory device such as an active mode, a read mode, or a refresh mode.

72 Claims, 13 Drawing Sheets

CONTROLLER FOR DELAY LOCKED LOOP CIRCUITS

TECHNICAL FIELD OF THE INVENTION

The present invention relates to integrated circuits, and in particular to a delay locked loop in a memory device.

BACKGROUND OF THE INVENTION

Delay locked loops (DLLs) are often used in integrated circuits (ICs) to generate an internal clock signal. In a typical DLL, the internal clock signal is generated by applying an amount of delay to a system clock or an external clock signal. The DLL tracks the external and internal clock signals with a detect operation and adjusts the amount of delay with a shifting operation to keep the internal and external clock signals synchronized.

In some integrated circuit devices, such as dynamic random access memory (DRAM) devices, the internal clock signal generated by the DLL is normally used as a timing signal for certain operations of the memory device. For example, in some memory devices, the internal clock signal can be used as a clock signal to provide timing for data transfer to and from the memory device.

A traditional memory device has a number of memory cells for storing data. To store data into the memory cells, a WRITE operation is performed. To retrieve the stored data, a READ operation is performed. Typically, a WRITE or READ operation includes two separate modes, an ACTIVE mode followed by a WRITE or READ mode. In the ACTIVE mode, the memory device activates a so-called ACTIVE command signal to "open" or activate the memory cells in preparation for a subsequent WRITE or READ mode. Following the ACTIVE mode, if it is a READ operation, the memory device activates a so-called READ command signal to access the activated memory cells to read the stored data in the memory cells.

Typically, activating the memory cells during the ACTIVE mode or accessing the memory cells during the READ mode demands a higher than normal amount of current which causes the internal supply voltage of the memory device to drop. The drop in the internal supply voltage changes the voltage supplied to the DLL. The change in the voltage supplied to the DLL causes a change in the amount of delay applied to the external clock signal. The change in the amount of delay causes the external and internal clock signals to be out of synchronism. When the external and internal signals are out of synchronism, the DLL performs a shifting operation to adjust the amount of delay to compensate for the drop in voltage during the ACTIVE mode to eventually put the external and internal clock signals back to synchronism.

Although the external and internal clock signal are eventually synchronized after the ACTIVE mode, the shifting operation during the ACTIVE mode may put the DLL in an unknown condition, which may change the timing for the data transfer of the memory device and move the data output timing out of the specification requirement. This change in the timing may not provide satisfactory level of accuracy for the data transfer of the memory device especially for new generations of high speed memory devices.

For the reasons stated above, and for other reasons stated below which will become apparent to those skilled in the art upon reading and understanding the present specification, there is a need for a method to control a DLL in an integrated circuit device such as a memory device during an ACTIVE or memory operational mode such as the ACTIVE or READ mode.

SUMMARY OF THE INVENTION

The present invention includes a method for controlling the DLL during a memory operational mode by disabling a synchronization operation of the DLL during the memory operational mode, such as an ACTIVE mode or a READ mode, so that the so that an unknown shifting condition of the DLL can be avoided to reduce the effect of a change in operating condition of the memory device to the DLL during the operational mode.

In one aspect, a memory device is provided. The memory device includes a DLL for generating an internal clock signal based on an external clock signal. The DLL keeps the external and internal clock signals synchronized by performing a synchronization operation. The memory device further includes a DLL controller connected to the DLL. During an operational mode of the memory device such as ACTIVE, READ or REFRESH mode, the DLL controller activates a DLL control signal to prevent the DLL from performing the synchronization operation.

In another aspect, a method of operating a DLL in a memory device is provided. The method includes generating an internal clock signal based on an external clock signal. The method also includes performing a synchronization operation to keep the external and internal clock signals synchronized. The method further includes activating a DLL control signal to disable the synchronization operation of the DLL during an operational of the memory device.

DETAILED DESCRIPTION OF THE INVENTION

The following detailed description refers to the accompanying drawings which form a part hereof, and which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
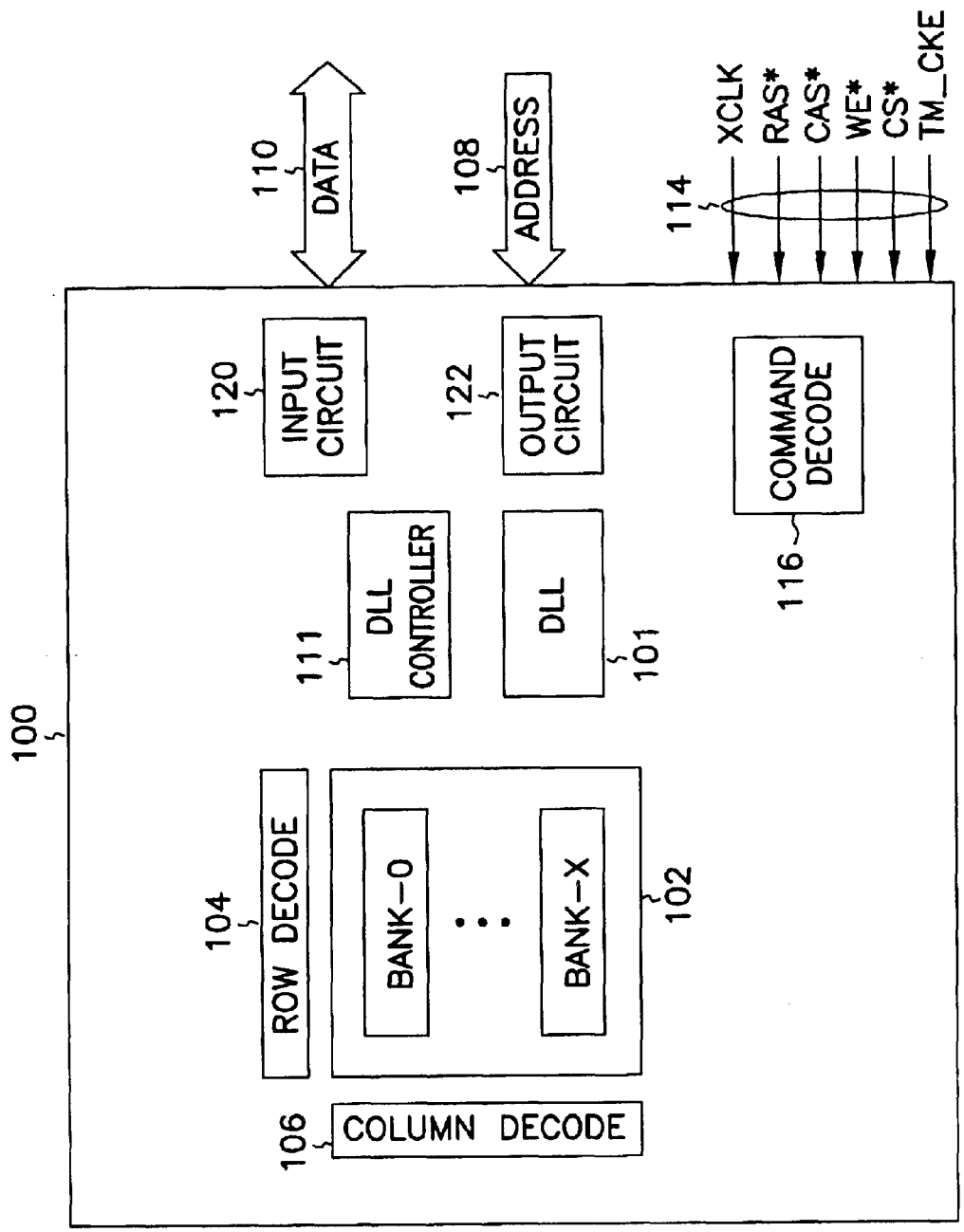
FIG. 1 is a block diagram of a memory device according to one embodiment of the invention.

FIG. 1 is a block diagram of a memory device 100 according to the invention. Memory device 100 includes a memory array 102. Memory array 102 includes a plurality of memory banks, indicated as BANK-0 to BANK-X. Each of the banks includes a plurality of memory cells arranged in rows and columns. Row decode circuit 104 and column decode circuit 106 access the rows and columns in response to an address, provided on a plurality of address lines or address bus 108. Data is transferred to and from memory device 100 through data lines or data bus 110. A command decode circuit 116 controls data communication to and from memory device 100 via an input circuit 120 and an output circuit 122 in response to input signals on input lines 114. Command decode circuit 116 receives the input signals on input lines 114 to determine the modes of operation of memory device 100 such as ACTIVE, WRITE, READ or REFRESH. Different combinations of the input signals activate different mode of operation of memory device 100. For example, one combination of the input signals activate the ACTIVE mode. Another combination of the input signals activate the READ mode. The input signals on lines 114 include, but are not limited to, External Clock (XCLK), Row Access Strobe (RAS*), Column Access Strobe (CAS*), Write Enable (WE*), Chip Select (CS*), and enable clock or test mode control TM_CKE.

In addition, memory device 100 also includes a DLL 101. In one embodiment, DLL 101 is a digital DLL. DLL 101 applies an amount of delay to the external clock signal XCLK to generate an internal clock signal. The internal and external clock signals are normally synchronized. In other words, the external and internal clock signals normally have the same phase. DLL 101 includes a phase detect operation in which the DLL detects for any difference in phase between the external and internal clock signals. The difference in phase is caused by variations in operating conditional of memory device 100. When a phase difference exists, DLL 101 performs a shifting operation to adjust the amount of delay to keep the external and internal clock signals synchronized. The internal clock signal is used by output circuit 122 to transfer data from memory array 102 to data lines 110 during a memory operation such as a READ operation.

According to the teachings of the present invention, memory device 100 further includes a DLL controller 111. DLL controller 111 provides a DLL control signal based on certain combination of the input signals received on input lines 114 of memory device 100. The DLL control signal is used to control DLL 101 during certain memory operational modes. According to the invention, the DLL control signal generated by DLL controller 111 disables the shifting operation of DLL 101 during a memory mode, such as an ACTIVE mode. When the shifting operation is disabled during the ACTIVE mode, the unknown shifting condition is avoided. This reduces the effect of the change in operating condition of the memory device on the DLL such as the drop in the internal supply voltage during ACTIVE mode.

Memory device 100 of FIG. 1 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 100 of FIG. 1 is simplified to illustrate one embodiment of a memory device of the present invention and is not intended to be a detailed description of all of the features of a memory device.

Figure 2:
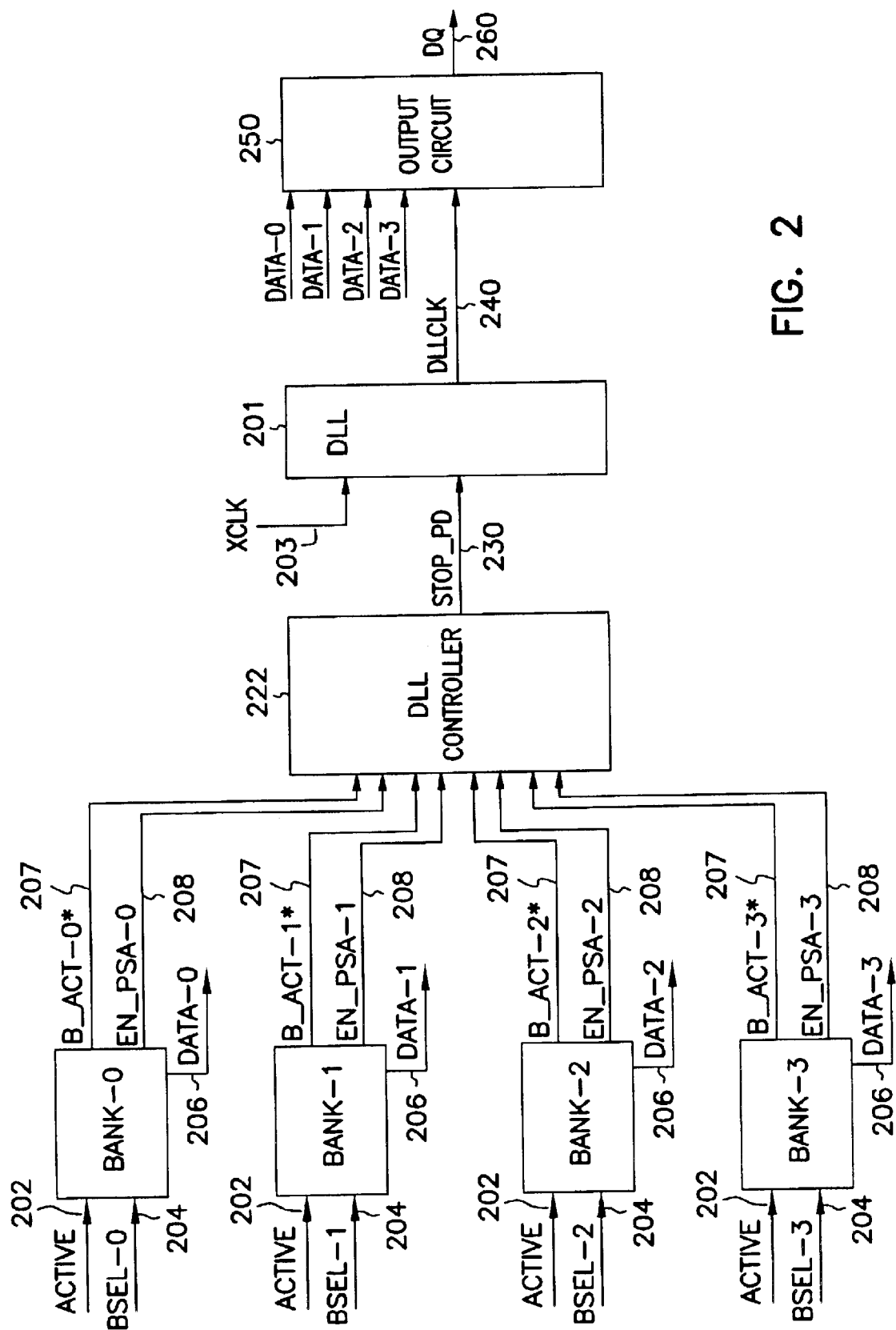
FIG. 2 is block diagram showing in more detail a portion of the memory device of FIG. 1.

FIG. 2 is a block diagram showing in more detail a portion of the memory device 100 of FIG. 1. FIG. 2 shows four memory banks indicated by BANK-0, BANK-1, BANK-2 and BANK-3. BANK 0–3 are shown in FIG. 1 as BANK 0–X. For simplicity, only four memory banks are shown in FIG. 2. However, the number of memory banks in FIG. 2 can be different. Each of BANK 0–3 includes a first input connected to line 202 to receive an active command signal ACTIVE, and a second input connected to line 204 to receive one of the bank select signals BSEL 0–3. For example, BANK-0 receives the ACTIVE signal and the BSEL-0 signal. In the embodiment of FIG. 2, each of the BANK 0–3 further includes outputs connected to lines 206, 207 and 208. Each of the outputs at lines 206 provides one of the data signals DATA 0–3. Each of the outputs at lines 207 provides one of the bank active mode indicator signal B_ACT 0–3*. Each of the outputs at lines 208 provides one of the enable p-sense amplifier signals EN_PSA 0–3. For example, BANK-0 provides a data signal DATA-0, an active mode indicator signal B_ACT-0*, and an enable p-sense amplifier signal EN_PSA-0. When a bank is in the ACTIVE mode, its B-ACT* and EN_PSA signals are activated. The B_ACT* is activated when it has a low signal level (LOW); the EN_PSA is activated when it has a high signal level (HIGH).

The B_ACT* 0–3 and EN_PSA 0–3 signals are provided as input signals to a DLL controller 222 via DLL inputs connected to lines 207 and 208. DLL 222 is shown in FIG. 1 as DLL controller 111. DLL controller 222 outputs a DLL control signal STOP_PD on its output, which connects to line 230. The STOP_PD signal is provided to a DLL 201. DLL 201 is shown in FIG. 1 as DLL 101. DLL 201 receives an external clock signal XCLK on line 203 to generate an internal clock signal DLLCLK on a DLL output connected to line 240. The DLLCLK signal is provided as input clock signal to an output circuit 250, which is shown in FIG. 1 as output circuit 122. Output circuit 250 includes inputs connected to lines 206 to receive the data signals DATA 0–3. Output circuit 250 pass the DATA 0–3 to its output on line 260 as a data output signal DQ.

In operation, certain combinations of the input signals, such as input signals on lines 114, sets the memory device in an operational mode. The operational mode includes, but is not limited to, an ACTIVE mode, a READ mode, and a REFRESH mode. In the ACTIVE mode, the ACTIVE command signal is activated (HIGH). The ACTIVE command signal on line 202 is activated by a certain combination of the input signals. For example, when the combination of the RAS*, CAS*, WE* and CS* signals on input line 114 is LOW, HIGH, HIGH, LOW, the ACTIVE command signal is activated. In the ACTIVE mode, one or more BANK 0–3 can be selected to access the memory cells in the selected bank. A bank is selected by activating the BSEL signal. The BSEL signal is activated based on signals provided on address lines such as lines 108 shown in FIG. 1.

In the ACTIVE mode, the memory cells of the selected bank are "opened" or activated in preparation for subsequent access of the memory cells such as a subsequent READ mode following the ACTIVE mode. For example, if BANK-0 is selected during the ACTIVE mode, certain memory cells of BANK-0 are activated. In the subsequent READ mode, data from those memory cells of BANK-0 is read to output line 206 as the DATA-0 signal. The DATA-0 signal is transferred to output circuit 250. Subsequently, output circuit 250 outputs the DATA-0 signal to output line 260 as the DQ signal. The timing of data transfer at output circuit 250 is provided by DLL 201. DLL 201 receives the XCLK signal to generate the DLLCLK signal. DLL 201 operates in a fashion such that the XCLK, DLLCLK and DQ signals are kept synchronized.

During the ACTIVE mode, a higher than normal amount of current is used by the memory. This causes the supply voltage of the memory device to drop. DLL controller 222 operates to stop DLL 201 from reacting to the drop in the supply voltage to keep the XCLK, DLLCLK and DQ as close to synchronism as possible to ensure the accuracy of the data transfer. In FIG. 2, in the ACTIVE mode, at least one of the BANK 0–3 is selected. Thus at least one of the B_ACT 0–3* and one of the EN_PSA 0–3 signals are activated. In response to the activated B_ACT* and EN_PSA signals, DLL controller 222 activates the STOP_PD signal. The activated STOP_PD signal causes DLL 201 to ignore the change in operating condition such as the drop in the voltage supply during the ACTIVE mode. In other words, the activated STOP_PD signal causes the DLL to suspend its shifting operation during the ACTIVE mode. The STOP_PD signal is deactivated when the memory device restores its supply voltage to the voltage level it was at before the ACTIVE mode was activated. When the STOP_PD is deactivated, the shifting operation is resumed.

Figure 3:
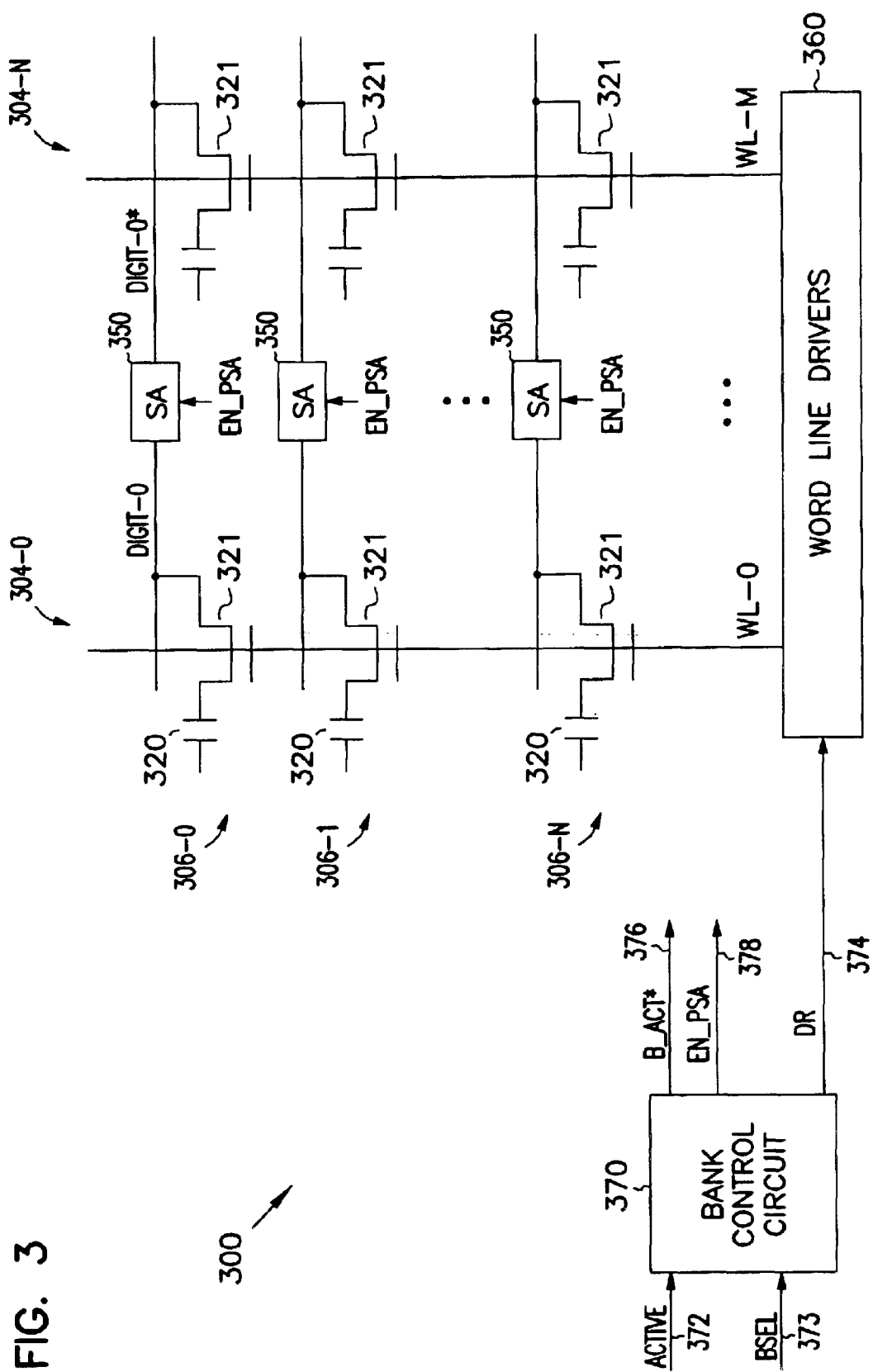
FIG. 3 is a circuit diagram of a memory bank according to one embodiment of the invention.

FIG. 3 is a circuit diagram of a memory bank according to one embodiment of the invention. In FIG. 3, memory bank 300 represents of one of the BANK 0–3 shown in FIG. 1 or FIG. 2. Bank 300 includes a plurality of rows of memory cells 304-0 to 304-N and a plurality of columns of memory cells 306-0, 306-1 to 306-N. The rows and columns of memory cells include a plurality of memory cells 320, such as DRAM memory cells having capacitors or storage cells, connected to a plurality of access transistors 321. The memory cells in the same row connect to a row line or word line. For example, memory cells 320 of row 304-0 connect to a word line WL-0, memory cells 320 of row 304-N connect to a word line WL-N. The word lines WL 0–N connect to word line drivers 360. The memory cells in the same column connect to a plurality of complementary digit lines DIGIT and DIGIT*. For example, column 306-0 connects to DIGIT-0 and DIGIT-0*. The complementary digit lines connect to a plurality of sense amplifiers (SA) 350. In one embodiment, sense amplifiers 350 include an n-sense amplifier and a p-sense amplifier.

In the embodiment of FIG. 3, bank 300 has an open digit line architecture as is known to those of ordinary skill in the art. In the open digit line structure, the DIGIT and DIGIT* lines connect to opposite sides of sense amplifiers 350. However, bank 300 can also be a folded digit line architecture in which the DIGIT and DIGIT* lines connect to the same side of sense amplifier 350. Sense amplifiers in a memory device such as sense amplifiers 350 are well known to those skilled in the art. Therefore, sense amplifier 350 is not described in detail in this disclosure.

Bank 300 further includes a bank control circuit 370. Circuit 370 includes inputs connected to lines 372 and 373 to receive an active command signal ACTIVE and a bank select signal BSEL. A plurality of outputs connect to bank control circuit 370 via lines 374, 376 and 378 to provide a word line drive signal DR, a bank active mode indicator signal B_ACT*, and an p-sense amplifier enable signal EN_PSA. These signals are similar to the signals shown with the same names in FIG. 2.

In operation, the ACTIVE and BSEL signals are activated causing bank control circuit 370 to activate the B_ACT*, EN_PSA, and DR signals. The B_ACT* signal is provided as one of the B_ACT 0–3* signals to DLL controller 222 of FIG. 2. The EN_PSA signal enables the p-sense amplifier of sense amplifier 350 to fire during a sensing operation to sense the voltage levels on the DIGIT and DIGIT* lines. The sensing operation of a sense amplifier in a memory device such as sense amplifier 350 is well known in the art. Therefore, the sensing operation of the p-sense amplifier is not described in detail in this disclosure. An activated DR signal causes word line drivers 360 to apply a HIGH signal to one of the selected word lines WL 0–N. A word line is selected by address signals on lines 108. For example, when word line WL-0 is selected, a HIGH is applied to WL-0. This turns on access transistors 321 connected to the word line WL-0 to open or activate memory cells 320 of row 304-0. The memory cells of the activated row are thus prepared for a subsequent memory operation such as a READ mode. In another embodiment, during the ACTIVE mode, a column of memory cells such as column 306-0 is activated.

Figure 4:
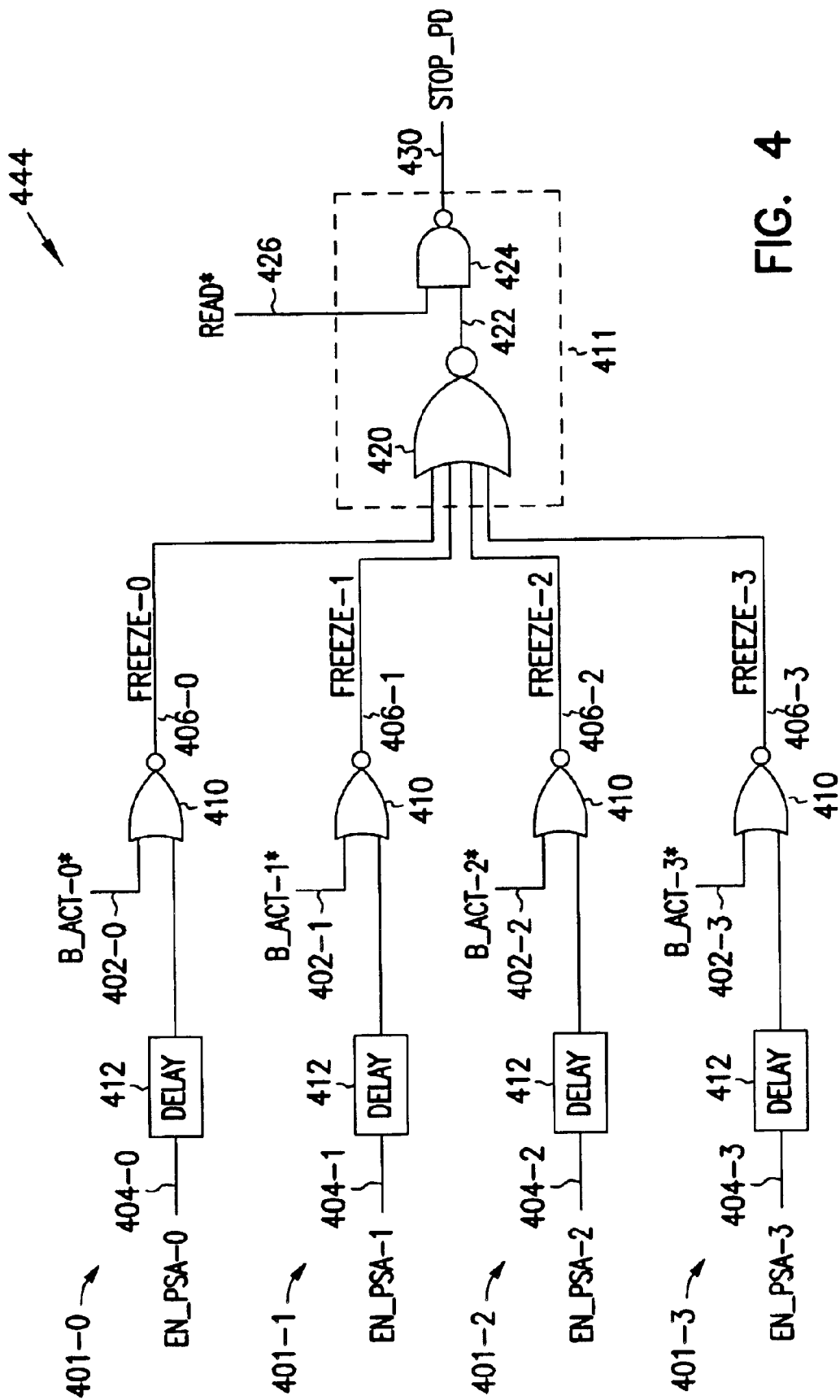
FIG. 4 is a block diagram of a DLL controller according to one embodiment of the invention.

FIG. 4 is a block diagram of a DLL controller 444 according to one embodiment of the invention. DLL controller 444 is shown in FIG. 1 or 2 as DLL controller 111 or 222. DLL controller 444 includes a plurality of input logic circuits 401-0 to 401-3. Each of the input logic circuits 401 0–3 includes a plurality of inputs for receiving input signals from a corresponding bank of memory, and an output for providing an output signal. For example, input logic 401-0 includes first and second inputs connected to lines 402-0 and 404-0 for receiving input signals from BANK-0 including an active mode indicator signal B_ACT-0* and a sense amplifier enable signal EN_PSA-0. Input logic 401-0 further includes an output connected to line 406-0 for proving a disable signal FREEZE-0. Other input logic circuits have similar construction as that of input logic circuit 401-0. Together, input logic circuits 401 0–3 provide a plurality of output signals FREEZE 0–3 on lines 406 0–3.

In one embodiment, each of the input logic circuits includes a NOR gate 410. NOR gate 410 has an input connected to one of the lines 402 0–3 to receive one of the B_ACT 0–3* signals. Another input of NOR gate 410 connects to one of the lines 404 0–3 through a delay 412 to receive one of the EN_PSA 0–3 signals. The output of NOR gate 410 connects to one of the lines 406 0–3 to provide one of the FREEZE 0–3 signals.

DLL controller 444 also includes an output logic circuit 411. Output logic circuit 411 includes a plurality of inputs connected to lines 406 0–3 to receive the FREEZE 0–3 signals. An output of output logic circuit 411 connects to line 430 for providing a DLL control signal STOP_PD. In one embodiment, output logic circuit 411 includes a NOR gate 420 having inputs connected to lines 406 0–3 to receive the FREEZE 0–3 signals. The output of NOR gate 420 connects to line 422, which connects to one input of a NAND gate 424. Another input of NAND gate 424 connects to line 426. Line 426 connects as an input of DLL controller 444 to receive a memory command signal such as a READ command signal. An output of NAND gate 424 connects to line 430 to provide the DLL control signal STOP_PD.

In the embodiment of FIG. 4, the memory command signal on line 426 is represented by a read command signal READ*. The READ* signal is activated when the memory device is in a READ mode. In the READ mode, the memory cells are accessed for reading the data stored in the memory cells. The memory command signal on line 426, however, can be a REFRESH command signal or other command signal. The REFRESH command signal is activated when the memory is in a REFRESH mode. In the REFRESH mode, data in stored in the memory cells are refreshed to ensure that the memory cells retain their valid data values.

DLL controller 444 operates to activate the DLL control signal STOP_PD to stop the shifting operation of DLL during a memory operational mode such as the ACTIVE mode. In general, when one of the BANK 0–3 is selected during the ACTIVE mode, one of the input logic circuits 401 0–3 activates one of the FREEZE 0–3 signals causing output logic circuit 411 to activate the STOP_PD signal. The activated STOP_PD disables the shifting operation of the DLL such as DLL 201, shown in FIG. 2, of the memory device during the ACTIVE mode. The DLL resumes the shifting operation after the memory device restores the internal supply voltage to the voltage level existing before the ACTIVE mode was activated.

Figure 5:
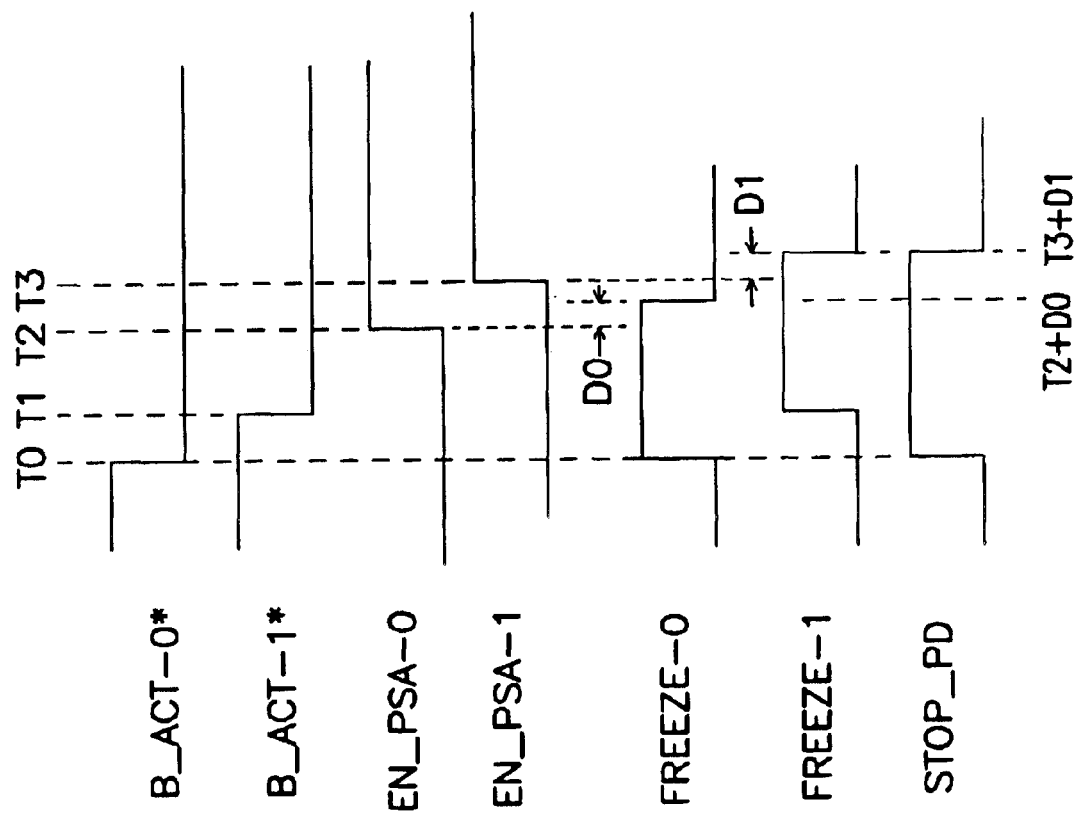
FIG. 5 shows a timing diagram of signal relationship of the signals of the DLL controller of FIG. 4.

The detailed operation of DLL controller 444 is better understood with the timing diagram of FIG. 5. FIG. 5 shows a timing diagram of signal relationship of the signals of DLL 444 in operation. In FIG. 4, for simplicity only the signals of BANK 0–1 are shown. Initially, before time T0, the B_ACT 0–1* signals are HIGH indicating BANK 0–1 are not in the ACTIVE mode. The EN_PSA 0–1 signals are LOW indicating the p-sense amplifiers of BANK 0–1 are not activated. At time T0, the B_ACT-0* signal switches LOW indicating BANK-0 is in the ACTIVE mode. At time T1, the B_ACT-1* signal also switches to LOW indicating BANK-1 is also in the ACTIVE mode. The EN_PSA-0 signal is also LOW at time T1. As stated above, the ACTIVE mode is issued by certain combinations of the input signals such as the RAS*, CAS*, WE* and CS* signals shown in FIG. 1; the BANK 0–3 are selected by certain combinations of address signals on lines 118.

Between times T0 and T2, both of the B_ACT-0* and EN_PSA-0 signals are LOW causing both inputs of NOR gate 410 to go LOW which forces a HIGH to the output of NOR gate 410 at line 406-0. This means the FREEZE-0 signal is HIGH forcing the output of NOR gate 420 at line 422 LOW. When one of the inputs, (e.g., on line 422) of NAND gate 424 is LOW, its output on line 430 is forced HIGH. Thus, between times T0 and T2, the STOP_PD signal is activated HIGH. The activated STOP_PD disables the shifting operation of the DLL, such as DLL 201 of FIG. 2, during the ACTIVE mode.

In FIG. 4, the STOP_PD is HIGH when one of the FREEZE 0–3 signals is HIGH. However, one of the FREEZE 0–3* is returned LOW a predetermined time after one of the corresponding EN_PSA 0–3 signals is activated HIGH. For example, in FIG. 5, between times T0 and T2, the FREEZE-0 is HIGH. At time T2, the EN_PSA-0 signal is activated HIGH. After a predetermined delay time caused by delay 412, indicated by D0 in FIG. 5, the input of NOR gate 410-0 connected to delay 412 will be HIGH. This forces a LOW to the signal at the output of NOR gate 410-0 or the FREEZE-0 signal. If BANK-0 is the only bank that is selected in the ACTIVE mode, the STOP_PD signal would be LOW or deactivated after time T2+D0 because the FREEZE-0 signal is LOW after time T2+D0. However, after time T2+D0, the B_ACT-1* signal is LOW indicating BANK-1 is still selected. Therefore, the STOP_PD signal is still forced HIGH. The STOP_PD signal is deactivated when all of the banks are not selected in the ACTIVE mode and after a predetermined time the EN_PSA signal of the last bank is activated.

At time T3, the EN_PSA-1 signal is activated HIGH. This is similar to the case when EN_PSA-0 switches HIGH. After a predetermined delay time, indicated by D1, the input of NOR gate 410-1 connected to delay 412 will be HIGH. This forces a LOW to the signal at the output of NOR gate 410-1 or the FREEZE-1 signal. At time T3+D1, the FREEZE 0–1 signals are LOW. This makes the signal at the output of NOR gate 420 HIGH, which forces a LOW to the signal at the output of NAND gate 424 or the STOP_PD signal.

In addition, the STOP_PD signal can also be activated in a READ mode. In the READ mode, the READ* signal on line 426 is activated LOW. A LOW on line 426 at the input of NAND gate 424 causes the signal at the output of NAND gate 424 or the STOP_PD signal HIGH. Thus, when the READ* signal is activated LOW, the STOP_PD signal is activated HIGH to disable the shifting operation of the DLL such as DLL 201. As mentioned previously, line 426 can also be applied with another command signal, such as the REFRESH command signal, to activate the STOP_PD signal at the output of NAND gate 424 to disable the shifting operation of the DLL during the REFRESH mode.

In summary, when the memory device is in an ACTIVE mode, DLL controller 444 activates the DLL control signal STOP_PD to prevent the DLL from performing the shifting operation. The STOP_PD signal is activated when one of the banks is selected during the ACTIVE mode. The STOP_PD is deactivated after the p-sense amplifier enable signal EN-PSA of the last selected bank is activated for a predetermined time during the ACTIVE mode.

Figure 6:
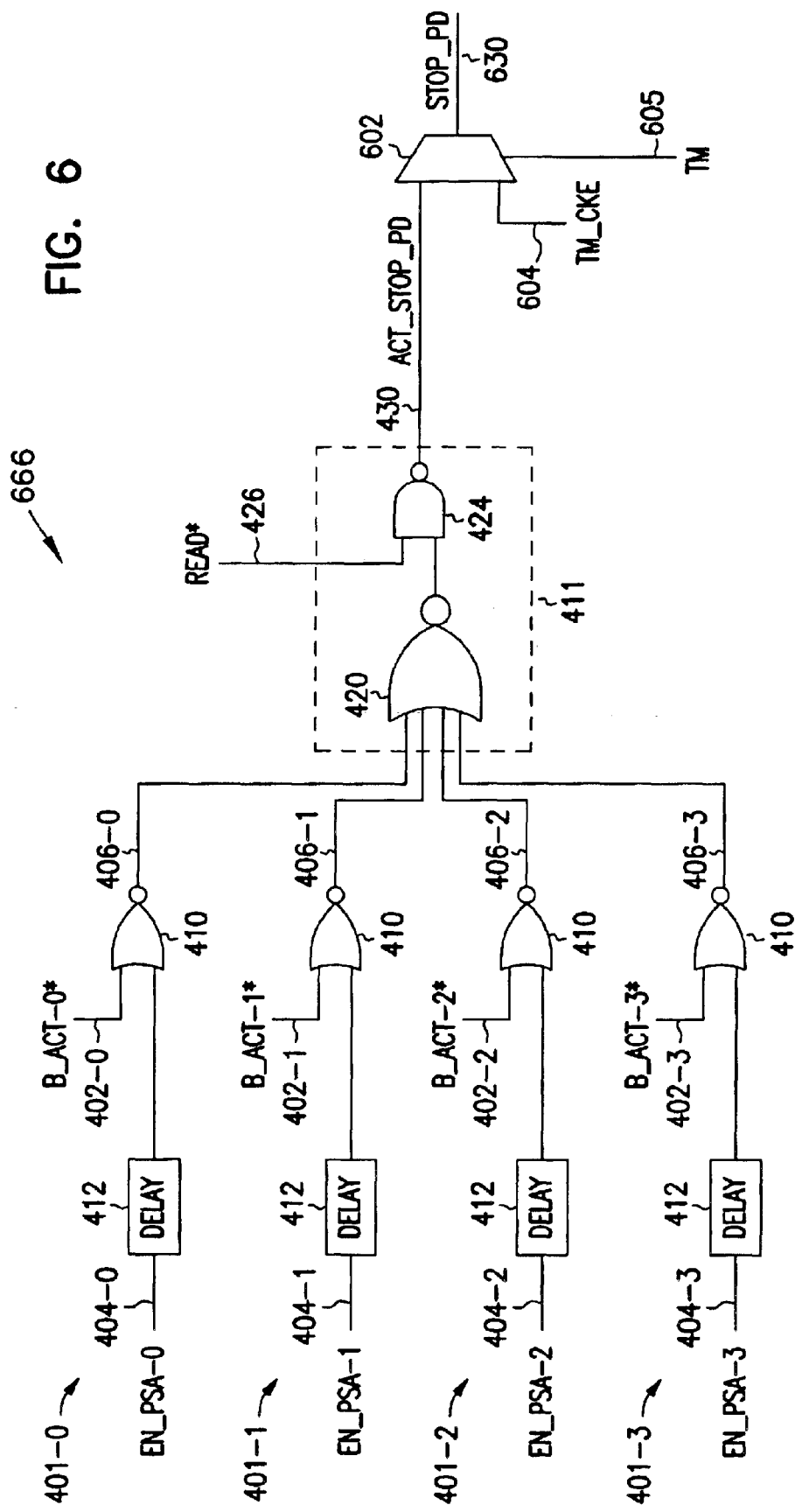
FIG. 6 is a block diagram of a DLL controller according to another embodiment of the invention.

FIG. 6 is a block diagram of a DLL controller 666 according to another embodiment of the invention. In FIG. 4, DLL controller 444 is only used for controlling the DLL during a normal memory mode such as an ACTIVE, READ or REFRESH mode. In FIG. 6, DLL controller 666 is used for monitoring the characteristics of the DLL during a test mode. DLL controller 666 is similar to DLL controller 444 shown in FIG. 4 except for the addition of a selector 602. For simplicity, reference numbers of the same elements in both DLL controllers are kept the same.

In the embodiment of FIG. 6, selector 602 is a multiplexor (MUX). MUX 602 includes a first input connected to line 430 to receive an active mode control signal ACT_STOP_PD, and a second input connected to line 604 to receive a test mode control signal TM_CKE. The TM_CKE signal is provided by one of the input lines such as input lines 114 shown in FIG. 1. MUX 602 is controlled by a test mode select signal TM on line 605. Based on the TM signal, MUX 602 selects either the ACT_STOP_PD or TM_CKE signal and passes it to the output of MUX 602 on line 630 as a DLL control signal STOP_PD. The STOP_PD signal of FIG. 6 serves the same purpose as the STOP_PD signal of FIG. 4. That is, the STOP_PD signal disables the shifting operation of the DLL.

The STOP_PD signal of FIG. 4 is activated during a normal operational memory mode whereas, the STOP_PD signal of FIG. 6 can be activated during a test mode. In the test mode, the TM_CKE signal can be activated in an asynchronous manner. That is, the activation of the TM_CKE signal is not dependent on the cycle time of the external or system clock signal such as the XCLK signal. Therefore, when the TM_CKE signal is asynchronously activated, the STOP_PD signal is also activated asynchronously. In contrast, the STOP_PD signal in FIG. 4 is activated in a synchronous manner. That is, the activation of the STOP_PD signal is based on the cycle time of the external clock signal. In other words, the STOP_PD signal of FIG. 4 can be activated only during the ACTIVE, READ or REFRESH mode, whereas the STOP_PD signal of FIG. 6 can be activated manually by activating the TM_CKE at anytime during the test to monitor the behavior or characteristics of the DLL during the test mode.

It is understood that in the test mode, the ACTIVE, READ and REFRESH modes can be simulated to determine the effect of these modes on the DLL. The simulation can be achieved by giving the right combinations of input signals on input lines such as lines 114 and 108 of memory device 100 shown in FIG. 1. Because the TM_CKE signal can be controlled during the test mode to activate or deactivate the STOP_PD signal during the test mode, the effect of the simulated ACTIVE, READ or REFRESH mode on the DLL during the test can also be monitored. For example, during a the test mode the TM_CKE signal can be activated or deactivated by toggling it signal levels between HIGH and LOW to activate or deactivate the STOP_PD signal. One way to observe the effect of the simulated ACTIVE, READ or REFRESH mode on the DLL is to record and compare the signal relationship between the XCLK signal and the DQ signal before and after the TM_CKE or the STOP_PD signal is activated during the test mode.

Referring to FIG. 6, the TM signal is activated HIGH during a test mode. The test mode is initiated by certain combination of the input signals such the RAS*, CAS*, WE* and CS* signals and certain combination of the address signals such as the address signals on address lines 108 of FIG. 1. MUX 602 operates in a manner such that when the TM signal is activated HIGH, it selects the TM_CKE signal as the STOP_PD signal. The TM_CKE signal can be activated asynchronously during the test. For example, the signal level (LOW or HIGH) of the TM_CKE signal can be changed any time during the test by changing the signal level on one of the input lines 114 shown in FIG. 1. In one embodiment, the TM_CKE signal on one of the input lines 114 is changed manually during the test, independent of the cycle time of an external clock signal such as the XCLK signal.

Because the TM_CKE can be controlled or activated asynchronously, the STOP_PD signal of FIG. 6 can also be activated asynchronously to disable to the shifting operation of the DLL any time during the test. In the test mode, the shifting operation of the DLL can be asynchronously activated or deactivated to monitor the behavior of the DLL in response to various operating condition or operating modes of the memory device. For example, the DLL characterization and analysis can be monitored by observing the signal relationship between the XCLK and the DQ signals when the shifting operation is asynchronously activated and deactivated by the TM_CKE signal.

Figure 7:
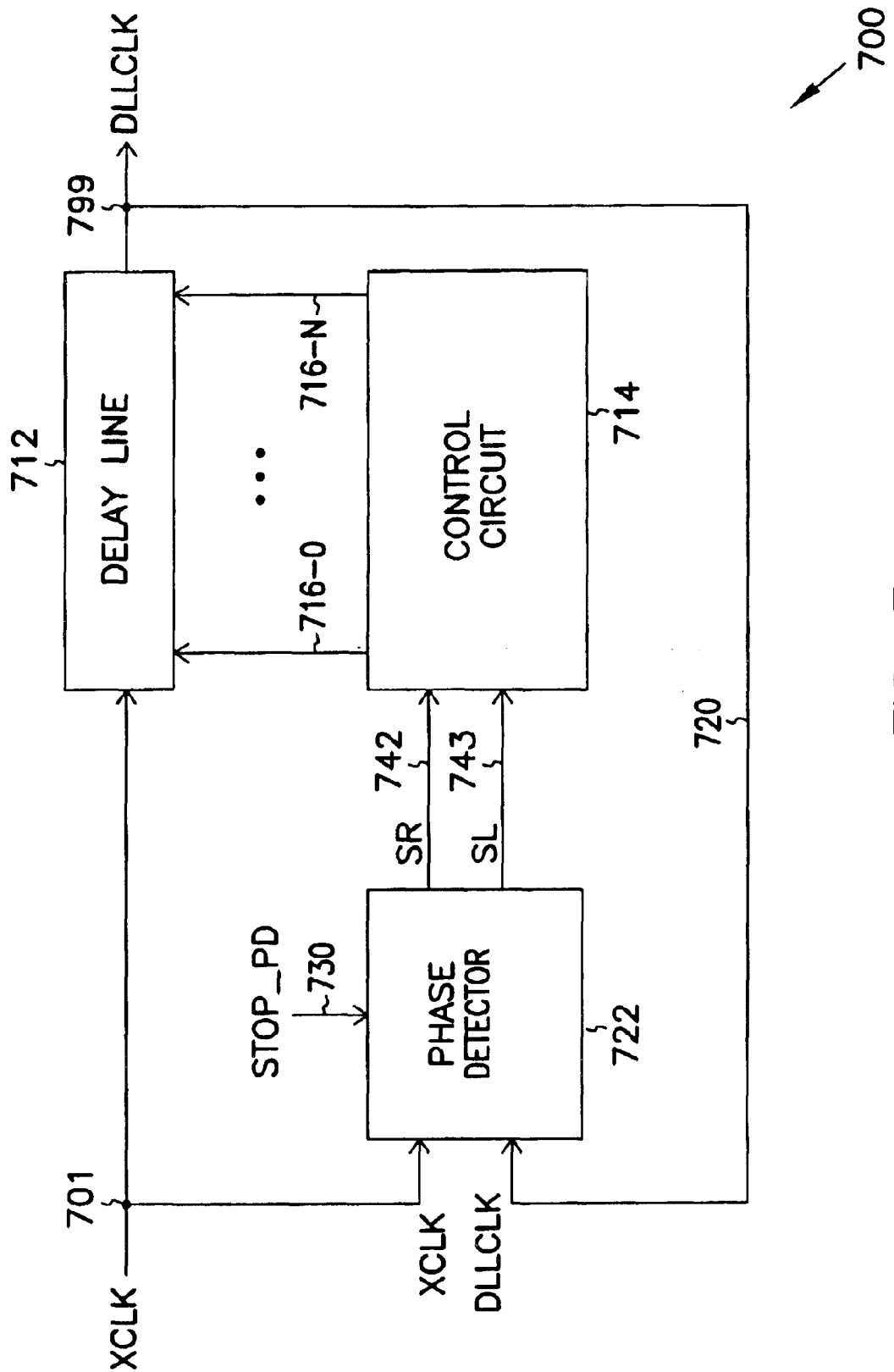
FIG. 7 is block diagram of a DLL according to one embodiment of the invention.

FIG. 7 is a block diagram of a DLL 700 according to the invention. DLL 700 is represented in FIG. 1 as DLL 101 or in FIG. 2 as DLL 201. DLL 700 has an input connected to line 701 to receive an external clock signal XCLK, and output connected to line 799 to provide an internal clock signal DLLCLK. The XCLK and DLLCLK signals are similar to the XCLK and DLLCLK signals shown in FIG. 2. In addition, DLL 700 includes an input connected to line 730 to receive a DLL control signal STOP_PD, which is similar to the STOP_PD signal shown in FIG. 4 and FIG. 6.

DLL 700 further includes a delay line 712. Delay line 112 has an input connected to node 701 to receive the XCLK signal, and an output connected to line 799 to provide the DLLCLK signal. Delay line 712 connects to a control circuit 714 through a plurality of control bits 716 0–N. The DLLCLK signal on line 799 is provided as a feedback signal on a feedback line 720, which connects to a phase detector 722. Phase detector 722 has inputs connected to line 701 and 720 to receive the XCLK and DLLCLK signals. Phase detector 722 also has outputs connected to lines 742 and 743 to provides a shift left signal SL and a shift right signal SR. The SL and SR are shifting signals. Phase detector 722 further includes an input connected to line 730 to receive the control signal STOP_PD.

In operation, delay line 712 applies a delay to the XCLK signal to generate the DLLCLK. The DLLCLK signal is fed back to phase detector 722 via feedback line 720. Phase detector 722 constantly samples the XCLK and the DLLCLK signals to compare the two signals. When the rising edges of the XCLK and DLLCLK signals are not lined up, i.e., when the XCLK and DLLCLK signals are not synchronized, phase detector 722 activates the SL or SR signal. Based on the SL or SR signal, control circuit 714 performs a shifting operation to adjust the delay applied to the XCLK signal to line up the edges of the XCLK and the DLLCLK signals. When the edges are lined up, i.e., when the XCLK and DLLCLK signals are synchronized, phase detector 722 disables the SL and SR signals. When the SL and SR signals are disabled, control circuit 714 stops the shifting operation. When the shifting operation is stopped, the DLL is in a lock position. When the DLL is locked, the XCLK and DLLCLK signals are synchronized.

DLL 700 normally remains in the lock position until phase detector 722 detects a difference in phase between the XCLK and DLL signals. A change in operating condition of the memory device may cause the XCLK and DLLCLK signals to be out of phase or not synchronized. When the XCLK and DLLCLK signals are not synchronized, the DLL repeats synchronization operation, i.e., the phase detect and the shifting operation to keep the XCLK and DLLCLK signals synchronized except when the STOP_PD is activated by DLL controller 444 or 666 as described in detail above.

Figure 8:
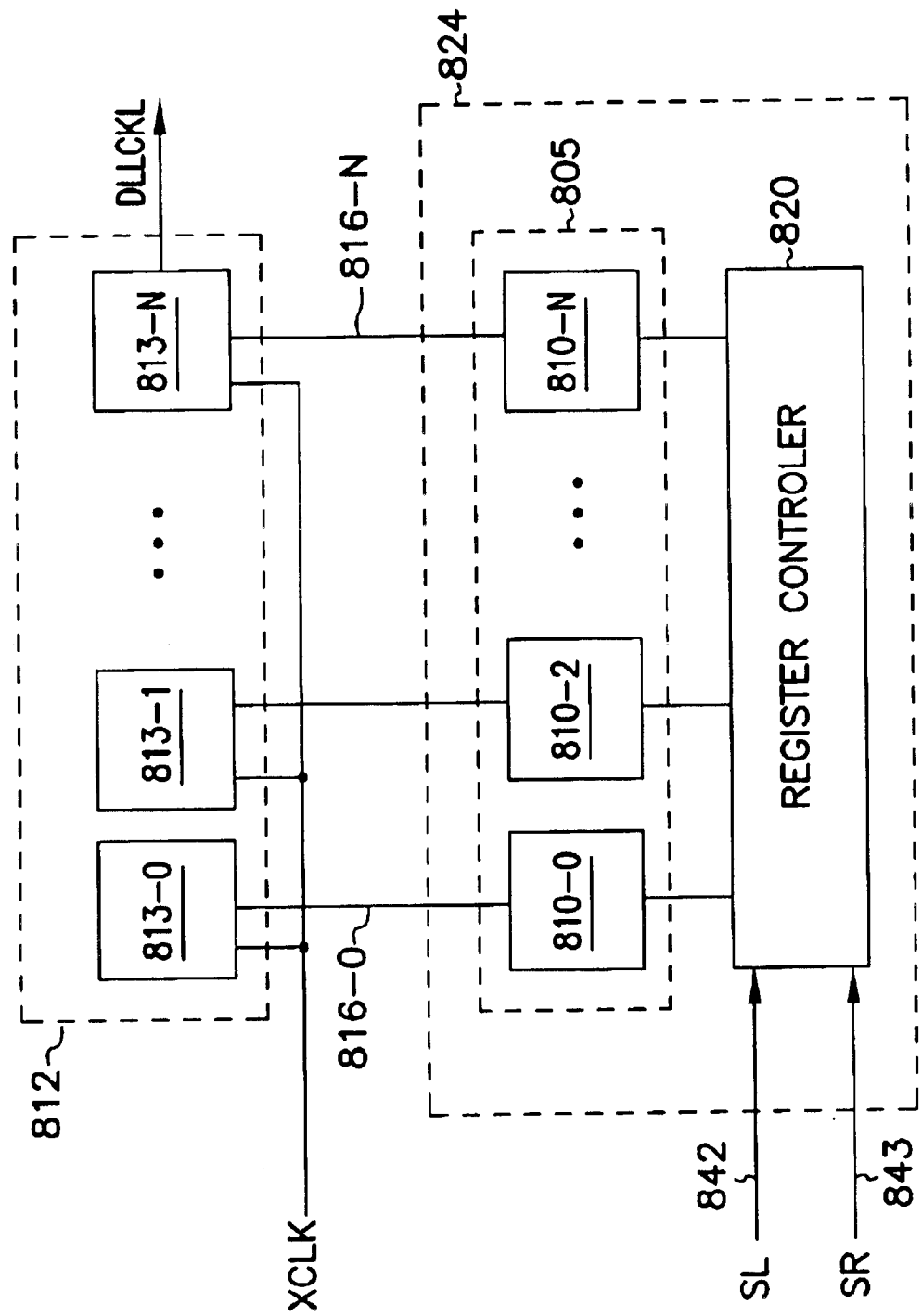
FIG. 8 is a block diagram of a delay line and a control circuit according to one embodiment of the invention.

FIG. 8 is a block diagram of a delay line 812 and a control circuit 824 according to one embodiment of the invention. Delay line 812 and control circuit 824 are shown as delay line 712 and controller 724 of FIG. 7. Delay line 812 includes a plurality of delay stages 813 0–N connected in series. Each of the delay stages connects to a common input at line 801 to receive the XCLK signal. Node 801 is shown as node 701 of FIG. 7. Each of the delay stages 813 0–N provides a delay (delay time). The amount of delay applied to the XCLK signal is equal to the delay of one delay stage multiplied by the number of delayed stages being used by delay line 812.

Control circuit 824 includes a shift register 805 connected to a register controller 820. Shift register 805 includes a plurality of shift register cells 810 0–N. Register cells 810 0–N include a plurality of outputs 816-0 to 816-N, which are shown as control taps 716 0–N in FIG. 7. The number of shift register cells 810 0–N is equal to the number of delay stages 813 0–N. Register controller 820 connects to lines 842 and 843 to receive the SL and SR signals, which are represented by the SL and SR signals on line 742 and 743 of FIG. 7.

In general, control circuit 824 receives either the SL or SR signal to adjust the amount of delay applied to the XCLK signal. In adjusting the amount of delay, control circuit 824 causes delay line 812 to increase or decrease the amount of delay. To increase the amount of delay, delay line 812 adds one or more delay stages to the number of delay stages being used. To decrease the amount of delay, delay line 812 removes one or more delay stages from the number of delay stages being used. The increase or decrease in the amount of delay changes the DLLCLK signal accordingly. After the DLLCLK signal is changed, the phase detector such as phase detector 722 shown in FIG. 7 compares the DLLCLK and XCLK signals. The phase comparison and delay adjustment process repeats until the XCLK and DLLCLK signals are synchronized. When the XCLK and DLLCLK signals are synchronized, the phase detector deactivates the SL and SR signals to lock the DLL. The DLL stays in the lock position unless the phase detector detects a change in phase between the XCLK and DLLCLK signals. When this occurs, the DLL repeats the phase comparison and delay adjustment process to ensure that the XCLK and DLLCLK signals are synchronized.

In operation, the XCLK signal enters delay line 812 at one of the delay cells 813 0–N and propagates through a pre-set numbers of delay cells to line 899 as the DLLCLK signal. The pre-set number of delay cells is initially set by register controller 820 such that only one of the register cells 810 0–N is activated. The activated register causes one of the corresponding output line 816 0–N to allow the XCLK signal to enter one of the delay cell. When register control circuitry 820 receives the SL or SR signal, control circuitry 824 performs a shifting operation, i.e., a shift left or shift right operation. In the shifting operation, control circuitry 824 shifts the selection of output lines 816 0–N along delay line 812 to select different number of delay cells 813 0–N that the XCLK signal passes through. For example, when the SL signal is activated, control circuitry 824 performs the shift left operation. In the shift left operation, a new output line to the left of the currently activated output line is selected. This increases the number of delay cells that the XCLK signal passes through. Therefore, the amount of delay applied to the XCLK signal is increased. Conversely, when the SR is activated, control circuitry 824 performs the shift right operation. In the shift right operation, a new output line to the right of the currently activated output line is selected. This decreases the number of delay cells that the XCLK signal passes through. Therefore, the amount of delay applied to the XCLK signal is decreased. Control circuitry 824 performs the shift left or shift right operation based on the activated SL or SR signal to adjust delay until the XCLK and DLLCLK signals are synchronized except when the STOP_PD is activated by DLL controller 444 or 666 as described in detail above.

Figure 9:
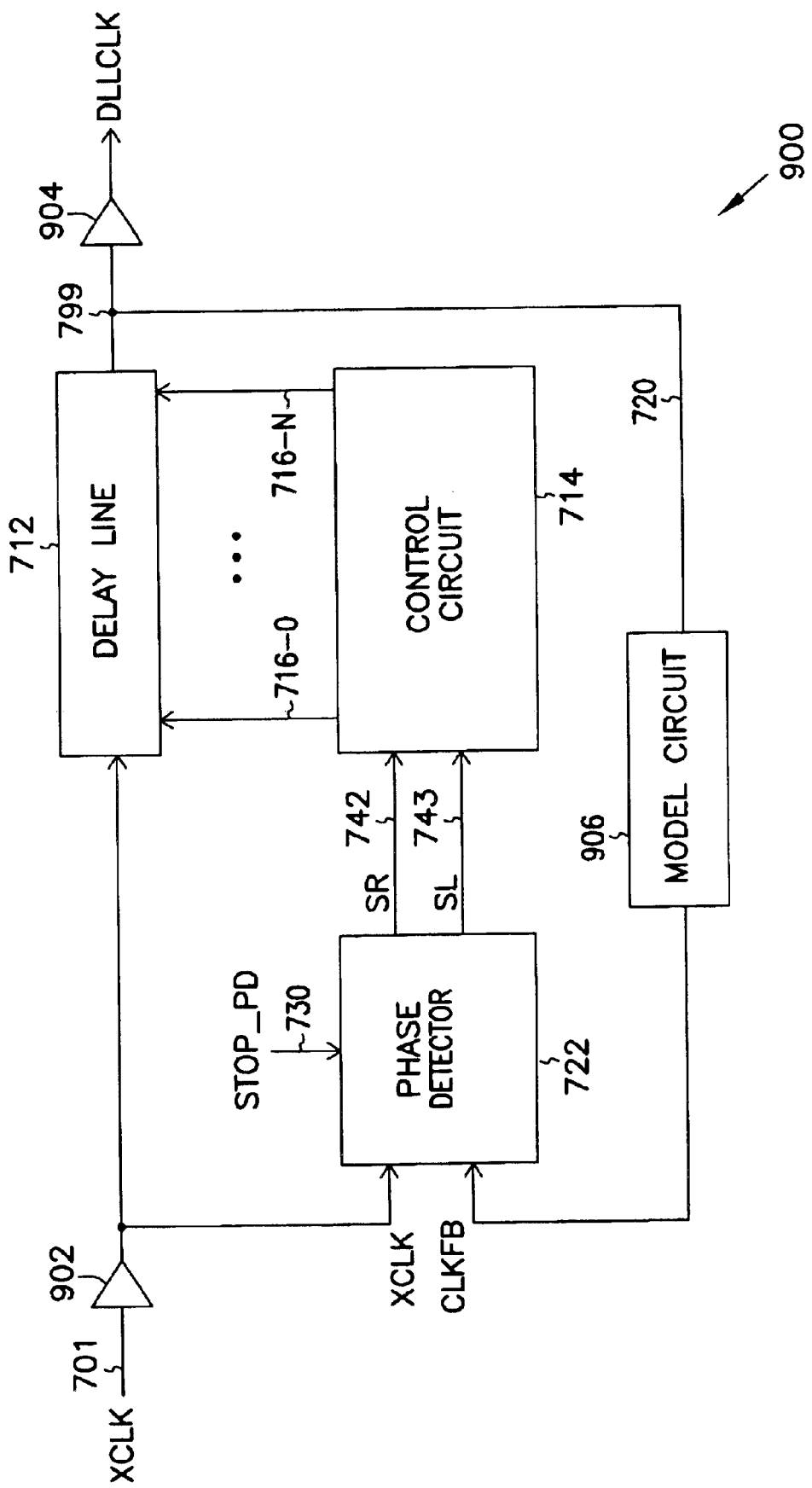
FIG. 9 is block diagram of a DLL according to another embodiment of the invention.

FIG. 9 is a block diagram of a DLL 900 according to another embodiment of the invention. DLL 900 is similar to DLL 700. However, DLL 900 includes additional circuit elements such as input and output buffers 902 and 904 and a model circuit 906. Other elements of DLL 900 are the same as the elements of DLL 700. For simplicity, the same elements are indicated by the same reference numbers. Input buffer 902 receives and drives the XCLK signal at input 701; output buffer 904 receives and drives the signal out of delay line 712. Because of the inclusion of buffers 902 and 904, model circuit 906 is designed to compensate for delays caused by buffers 902 and 904. Thus, model circuit is identical to input and output buffers 902 and 904. In DLL 700, the feedback signal is the same as the DLLCLK signal. In DLL 900, however, the feedback signal, indicated by CLKFB, is a delayed version of the DLLCLK signal. In other words the CLKFB signal is the DLLCLK signal delayed by a delay time equal to the delay time of the input and output buffers 902 and 904.

In another embodiment, model circuit 906 also includes other circuit element outside of DLL 900. For example, when the DLLCLK signal of DLL 900 is used as a clock signal in an output circuit such as output circuit 250 of FIG. 2, model circuit is identical to input and output buffers 902 and 904 and output circuit 250. This ensures that when the XCLK and DLLCLK signals synchronized, the output signal of output circuit 250 such as the DQ signal, is also synchronized with the XCLK clock signal.

DLL 900 operates in a similar manner as DLL 700 in which the shifting operation of control circuit 824 is based on the SL or SR signal. The SL or SR signal is activated based on a result of the phase detect operation of a phase detector such as phase detector 722 of FIG. 7. The SL or SR signal is activated when the XCLK and CLKFB signals are out of phase. The phase difference can be caused by a change in operating condition the memory device. As mentioned previously, a change in operating condition such as the drop in the supply voltage can occur during the ACTIVE mode. After detecting the change, the DLL performs the shifting operation to compensate for the voltage drop. The DLL, however, also performs additional shifting operation after the supply voltage is stable. The shifting operation during the ACTIVE mode may put the DLL in some unknown states that may affect the timing of the memory device.

According to one embodiment of the invention, a DLL controller such as DLL controller 444 disables the shifting operation of the DLL to prevent the DLL from performing the shifting operating during the ACTIVE mode to avoid the unknown shifting operation to keep the XCLK and DLLCLK signals as close to synchronism as possible during the ACTIVE mode. Furthermore, according to another embodiment of the invention, a DLL controller such as DLL controller 666 is used to disable the shifting operation of the DLL during a test mode.

Figure 10:
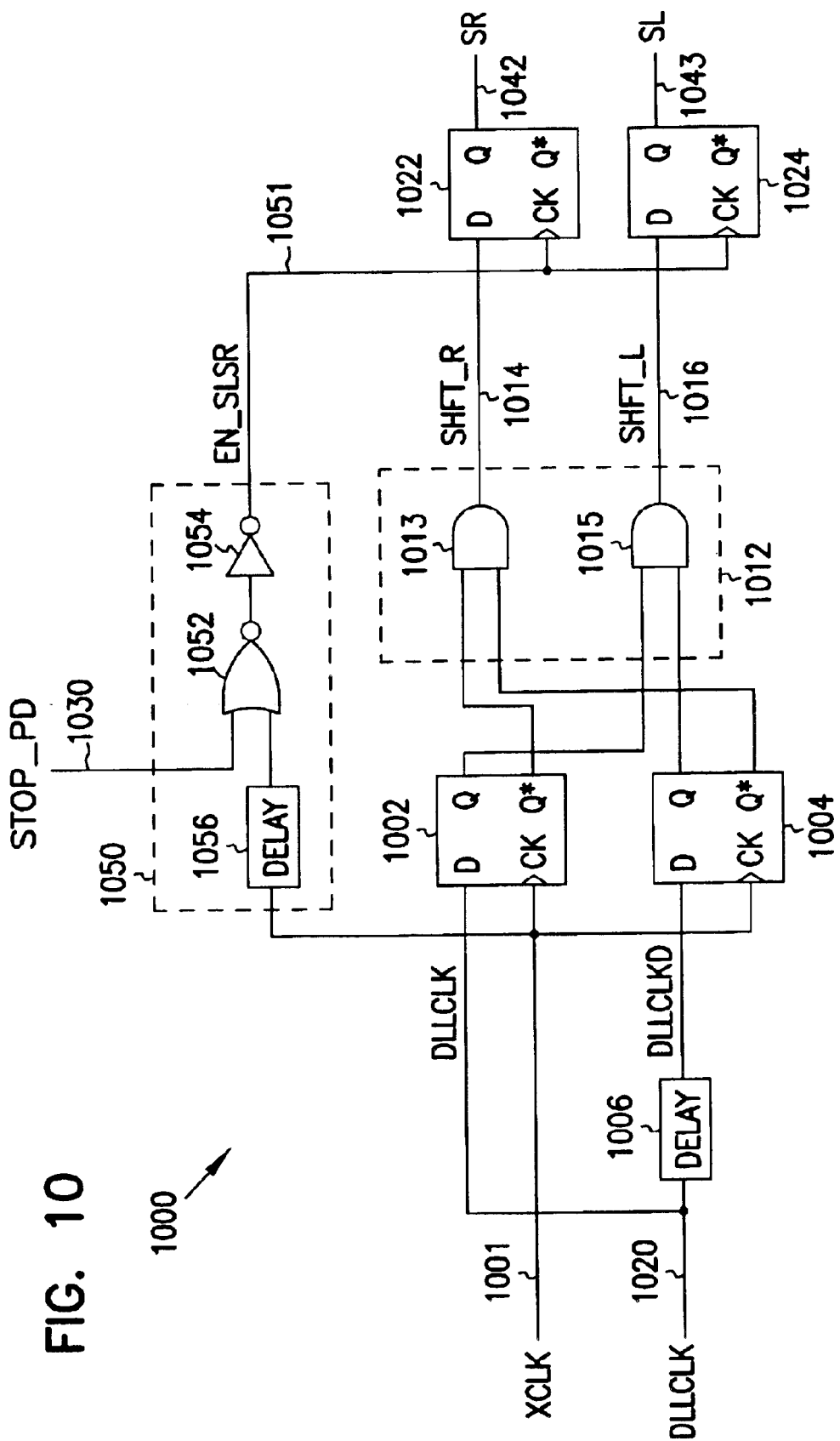
FIG. 10 is block diagram of a phase detector according to one embodiment of the invention.

FIG. 10 is block diagram of a phase detector 1000 according to one embodiment of the invention. Phase detector 1000 is shown as phase detector 722 in FIGS. 7 and 9. Phase detector 1000 includes first and second input latches 1002 and 1004. Latches 1002 and 1004 are DQ-type latches with each latch having a clock input CK, an input D and outputs Q and Q*. The clock inputs CK of both input latches connect to line 1001 to receive an external clock signal XCLK. Input D of latch 1002 connects to line 1020 to receive an internal clock signal DLLCLK. Input D of latch 1004 connects to line 1020 through a delay circuit 1006 to receive a delayed version of the signal DLLCLK which is indicated as DLLCLKD signal. Input latches 1002 and 1004 connect to a logic circuit 1012.

In one embodiment, logic circuit 1012 includes first and second NAND gates 1013 and 1015. NAND gate 1013 has inputs connected to outputs Q* of latches 1002 and 1004. NAND gate 1015 has inputs connected to outputs Q of latches 1002 and 1004. An output of NAND gate 1013 connects to line 1014 to provide a pre-shift left signal SHFT_L. An output of NAND gate 1015 connects to line 1016 to provide a pre-shift right signal SHFT_R.

Phase detector 1000 also includes first and second output latches 1022 and 1024. Latches 1022 and 1024 are the same type as latches 1002 and 1004. Input D of latch 1022 connects to line 1014 to receive the SHFT_L signal. Input D of latch 1024 connects to line 1016 to receive the SHFT_R signal. Output latches 1022 and 1024 have outputs connected to lines 1042 and 1043 to provide shifting signals SL and SR.

Phase detector 1000 further includes a shifting signal control circuit 1050. Circuit 1050 includes a first input connected to line 1001 to receive the XCLK signal. A second input of circuit 1050 connects to line 1030 to receive a DLL control signal STOP_PD. Moreover, shifting signal control circuit 1050 includes an output connected to inputs CK of output latches 1022 and 1024 via line 1051 to provide shifting control signal EN_SLSR. In one embodiment, shifting signal control circuit 1050 includes a NOR gate 1052 connected in series with an inverter 1054. One input of NOR gate 1052 connects to line 1030 to receive the STOP_PD signal. Another input of NOR gate 1052 connects to line 1001 through a delay circuit 1056 to receive a delay version of the XCLK signal. Delay circuit 1056 is the same as delay circuit 1006.

Phase detector 1000 operates to detect a phase different between the XCLK and DLLCLK signals by sampling the signals on lines 1001 and 1002. When the XCLK and DLLCLK signals are not synchronized, either the SL or SR signal is activated to initiate the shifting operation to adjust the delay to keep the XCLK and DLLCLK synchronized. When the XCLK and DLLCLK signals are not synchronized, two possible situations can occurs. The first situation occurs when the DLLCLK signal is leading the XCLK signal. In other words, the rising edge of the DLLCLK signal occurs before the rising edge of the XCLK signal. The second situation occurs when the DLLCLK signal is lagging the XCLK signal. In other words, the rising edge of the DLLCLK signal occurs after the rising edge of the XCLK signal.

Figure 11:
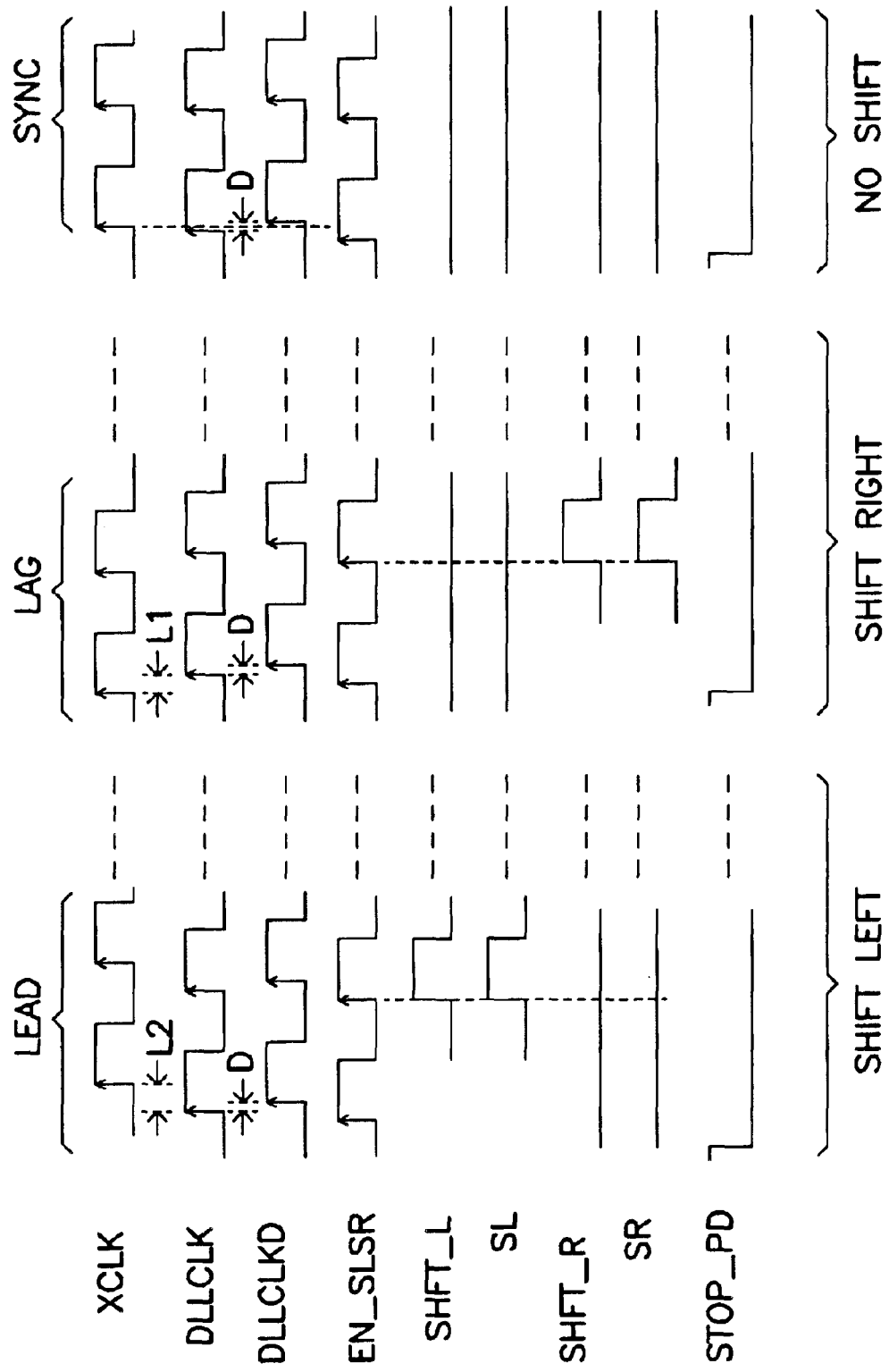
FIGS. 11 and 12 are timing diagrams of the operation the phase detector of FIG. 10.
Figure 12:
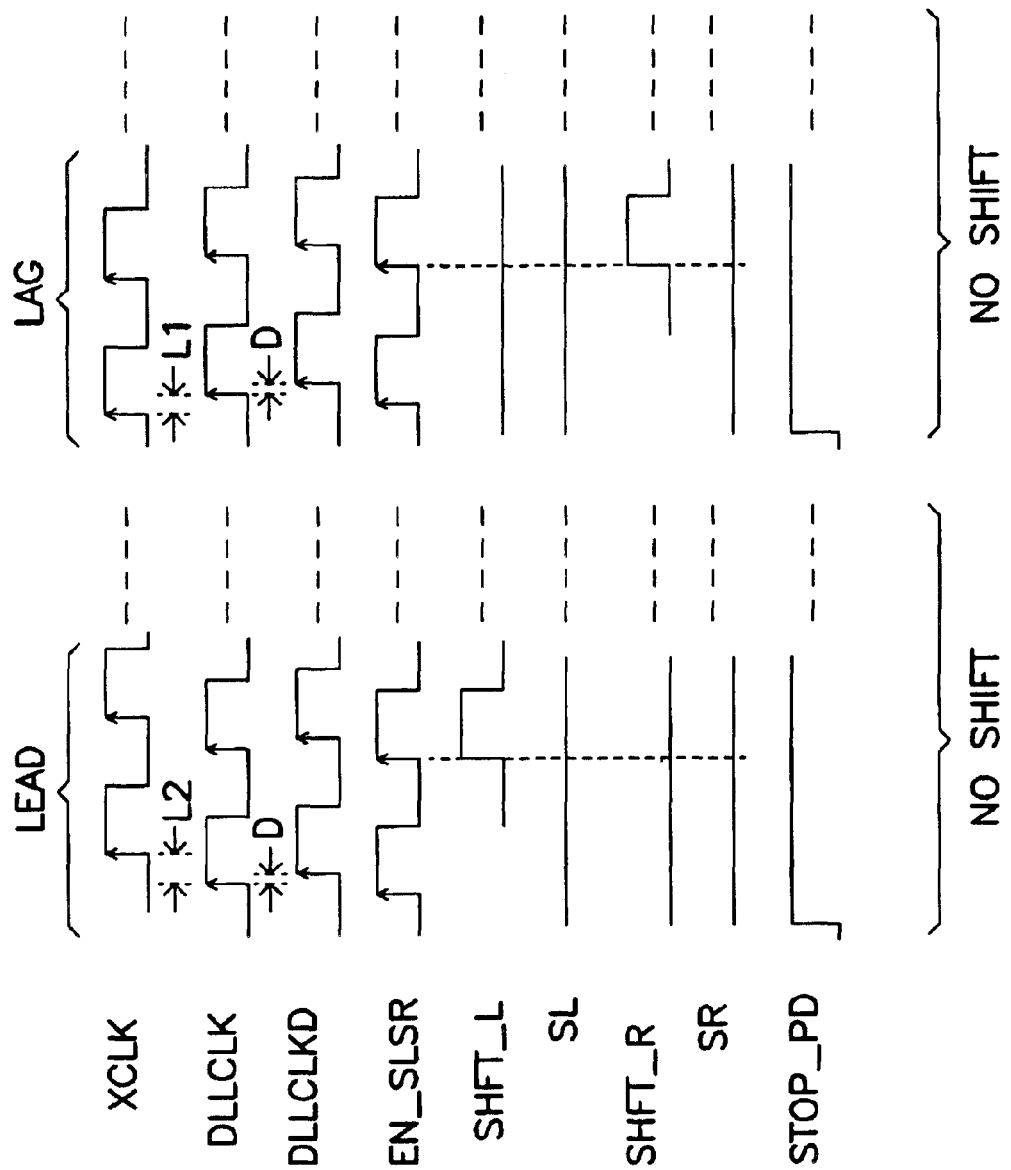

The operation of phase detector 1000 is better understood with the timing diagrams of FIG. 11 and FIG. 12. In FIG. 11, the STOP_PD signal is not activated. In FIG. 12, the STOP_PD signal is activated. In FIG. 11, timing portions indicated by "LEAD" and "LAG" show the two possible situations in which the XCLK and DLLCLK signals are not synchronized. Timing portion indicated by "SYNC" shows the XCLK and DLLCLK signals being synchronized. The SHIFT LEFT and SHIFT RIGHT indicate the DLL is performing the shift left and shift right operations; NO SHIFT indicates the DLL is not performing a shifting operation. Also in FIG. 11, L1 and L2 indicate the delay time that the rising edge of the DLLCLK signal leads or lags the XCLK signal, respectively; D indicates the delay time caused be delay 1006 of FIG. 10.

In the LEAD situation, the rising edges of the DLLCLK and DLLCLKD signals occur before the rising edge of the XCLK signal. In FIG. 11, the DLLCLK and DLLCLKD signals are HIGH at the rising edge of the XCLK signal. Since the DLLCLK and DLLCLKD are provided to inputs D of latches 1002 and 1004, the signals at inputs D are HIGH. At the rising edge of the XCLK signal, both outputs Q are registered HIGH because inputs D are HIGH. When both outputs Q are HIGH, the output of AND gate 1015 is forced HIGH, i.e., the SHFT_L signal is HIGH. When both outputs Q are HIGH, both outputs Q* are LOW. Thus, the outputs of AND gate 1013 is forced LOW, i.e., the SHFT_R signal is LOW. Assuming the memory device is not in the ACTIVE mode, e.g., the STOP_PD signal is not activated (is LOW). When the input of NOR gate 1052 connected to line 1030 being LOW, the signal at the output of NOR gate 1052, i.e., the EN_SLSR signal follows the signal on the other input of NOR gate 1052 which is a delayed version of the XCLK signal. In other words, when the STOP_PD signal is LOW, the EN_SLSR signal follows the XCLK signal.

Since the EN_SLSR signal is provided to clock inputs CK of latches 1022 and 1024, at the rising edge of the EN_SLSR signal, latches 1022 and 1024 register the SHFT_R and SHFT_L signals to output 1042 and 1043 as the SR and SL signals. In FIG. 11, at the rising edge of the EN_SLSR, the SHFT_L signal is HIGH and the SHFT_R signal is LOW. Thus, latches 1022 and 1024 register a LOW for the SR signal and a HIGH for the SL signal. In response to the SL signal, DLL performs a shift left operation to increase the amount of delay applied to the XCLK signal. Subsequent shift left operation may also be performed until the XCLK and DLLCLK signals are synchronized. In FIG. 11, the shift left operation is indicated by SHIFT LEFT.

In the LAG situation, the rising edges of the DLLCLK and DLLCLKD signals occur after the rising edge of the XCLK signal. Phase detector operates in a similar but opposite manner. In FIG. 11, at the rising edge of the XCLK signal, the DLLCLK and DLLCLKD signals are LOW. Since the DLLCLK and DLLCLKD are provided to inputs D of latches 1002 and 1004, the signals at inputs D are LOW. At the rising edge of the XCLK signal, both outputs Q are registered LOW because inputs D are LOW When both outputs Q are LOW, the output of AND gate 1015 is forced LOW, i.e., the SHFT_L signal is LOW. When both outputs Q are LOW both outputs Q* are HIGH. Thus, the output of AND gate 1013 is forced HIGH, i.e., the SHFT_R signal is HIGH Assuming the memory device is not in the ACTIVE mode, thus, the STOP_PD signal is not activated and the EN_SLSR signal follows the XCLK signal.

Since the EN_SLSR signal is provided to clock inputs CK of latches 1022 and 1024, at the rising edge of the EN_SLSR signal, latches 1022 and 1024 register the SHFT_R and SHFT_L signals are provided to output 1042 and 1043 by as the SR and SL signals. In FIG. 11, at the rising edge of the EN_SLSR, the SHFT_L signal is LOW and the SHFT_R signal is HIGH. Thus, latches 1024 and 1022 register a LOW for the SL signal and a HIGH for the SR signal. In response to the SR signal, DLL performs a shift right operation to decrease the amount of delay applied to the XCLK signal. Subsequent shift right operation may also be performed until the XCLK and DLLCLK signals are synchronized. In FIG. 11, the shift right operation is performed as indicated by SHIFT RIGHT.

The XCLK and DLLCLK signals are synchronized when the rising edge of the XCLK signal is in between or is within the rising edges of the DLLCLK and DLLCLKD signals. This situation is shown in the timing portion SYNC of FIG. 11, in which the rising edge of the XCLK signal switches HIGH after the rising edge of the DLLCLK signal switches HIGH and before the rising edge of the DLLCLKD signal switches HIGH. In FIG. 10, at the rising edge of the XCLK signal, the DLLCLK signal being HIGH and the DLLCLK signal being LOW cause input D of latch 1002 HIGH and input D of latch 904 LOW. This forces a HIGH and a LOW to outputs Q and Q* of latch 1002 and a LOW and a HIGH to outputs Q and Q* of latch 1004. Thus, both outputs Q are not at the same signal level and both outputs Q* are also not at the same signal level. This makes one of the inputs of AND gate 1013 go LOW and one of the inputs of AND gate 1015 to also go LOW. Therefore, the outputs of both AND gates 1013 and 1015 are LOW. This means both of the SHFT_R and SHFT_L signals provided by the outputs of both AND gates 1013 and 1015 are also LOW. At the rising edge of the EN_SLSR signal, both outputs of latches 1022 and 1024 will register LOW. This means the SR and SL signals are LOW or not activated. Therefore, the DLL does not perform the shift left or shift right operation and the XCLK and DLLCLK signals stay synchronized or locked until the phase detector detects a phase difference between the XCLK and DLLCLK signals. At that time, the synchronization operation, i.e., the shift left or shift right operation, is repeated to put the XCLK and DLLCLK signals back to synchronism.

However, in some situation such as in the ACTIVE mode of the memory device, the synchronization operation may not be desirable even though the activation of the ACTIVE mode may cause the XCLK and the DLLCLK signals out of synchronism. In such situation, according to the invention, the synchronization operation of the DLL is disabled. As described previously in FIG. 4, DLL control circuit 444 activates the DLL control signal STOP_PD to disable the shifting operation during the ACTIVE mode.

The operation of phase detector 1000 when the STOP_PD signal is activated is described in connection with a timing diagram of FIG. 12. In FIG. 10, the STOP_PD signal is provided on line 1030 of shifting signal control circuit 1050. Assuming that the XCLK and the DLLCLK signals are synchronized before the ACTIVE mode is activated, e.g., the SL and SR signals are not activated (are LOW). When the ACTIVE mode is activated, the STOP_PD signal is activated (HIGH). This causes the signal at the output of circuit 1050, i.e., the EN_SLSR signal to stay HIGH during the ACTIVE mode. Since the EN_SLSR signal is provided as the clock signal to output latches 1022 and 1024 and stays HIGH during the ACTIVE mode, changes in inputs of latches 1022 and 1024 will not be registered at outputs 1042 and 1043. In other words, because the EN_SLSR signal stays HIGH, changes in the SHFT_L or SHFT_R signal will not change the states of the SL or SR signal. The SL and SR signals remain LOW as long as the EN_SLSR signal remains HIGH.

FIG. 12 shows the timing diagram of phase detector 1000 when the STOP_PD signal is activated. For simplicity in comparison with operation of phase detector 1000 when the STOP_PD signal is not activated, the timing arrangement of FIG. 12 is similar to that of FIG. 11. In FIG. 12, when the XCLK and DLLCLK are not synchronized as indicated in the LEAD and LAG timing portions, the SHFT_L and SHFT_R signals are still registered (HIGH or LOW) by the result of the phase comparison by latches 1002 and 1004 and accordingly by logic circuit 1012 described in FIG. 11. In FIG. 12, however, the SL and SR signals are not activated even though the SHFT_L and SHFT_R signal are activated because the EN_SLSR signal remains HIGH during the LEAD or LAG situation in the ACTIVE mode. The EN_SLSR remains HIGH because the STOP_PD signal remains HIGH during the ACTIVE mode. Hence, during the ACTIVE mode, shifting signal control circuit 1050 disables the activation of the SL or SR signal to prevent the DLL from performing the shift left or shift right operation. The shifting operation will resume when the STOP_PD signal is deactivated at certain time after the ACTIVE mode is activated. The STOP_PD signal is deactivated when the supply voltage of the memory device resumes the level it had before entering the ACTIVE mode. In particular, as described in the embodiment of FIG. 4, the STOP_PD is deactivated a predetermined time after the EN_PSA is activated.

Figure 13:
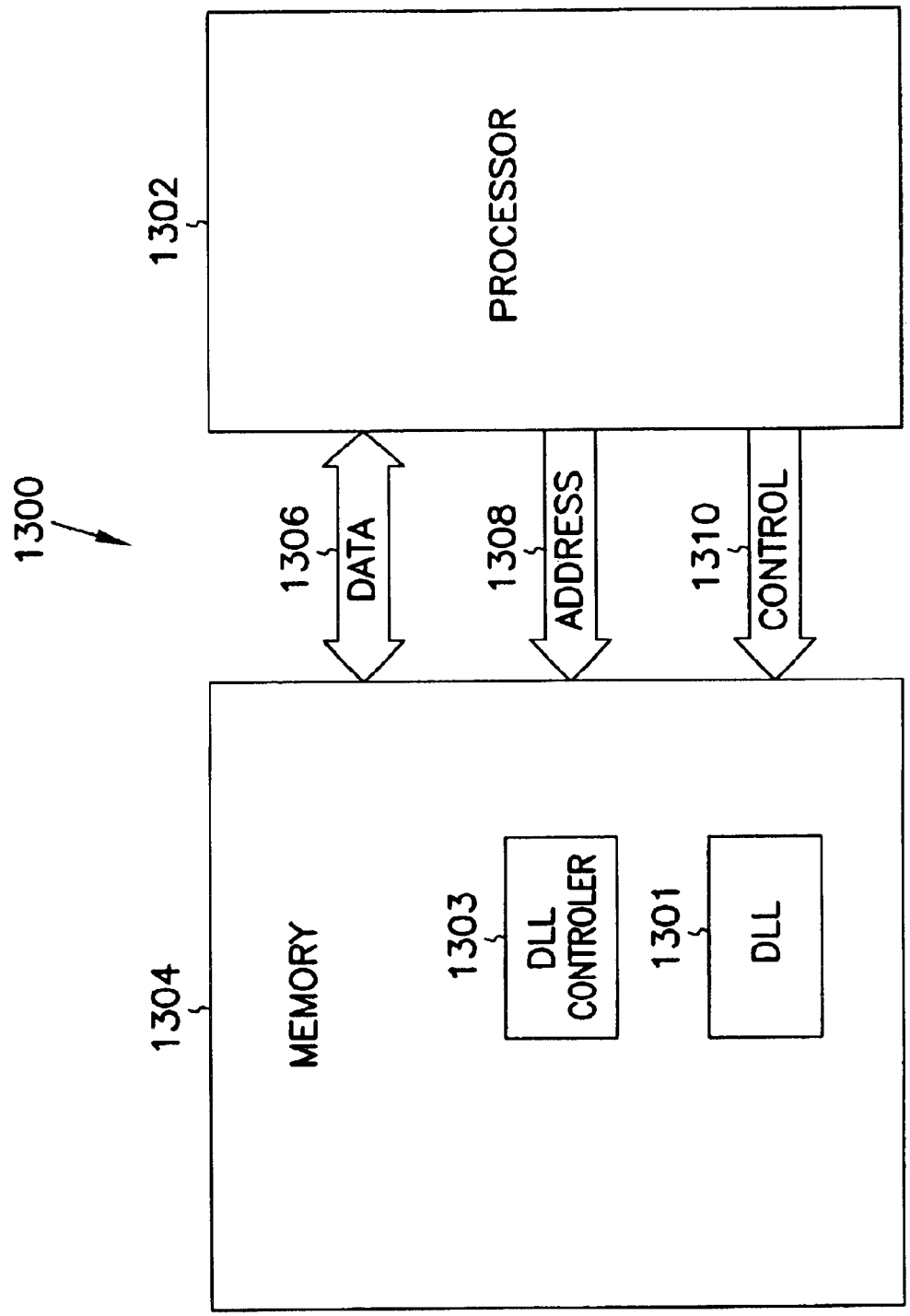
FIG. 13 is a block diagram of a system according to the invention.

FIG. 13 shows a system 1300 according to the invention. System 1300 includes a processor 1302 and a memory device 1304. Memory device 1304 represents memory device 100 of the invention. Processor 1302 can be a microprocessor, digital signal processor, embedded processor, microcontroller, or the like. Processor 1302 and memory device 1304 communicate using address signals on lines 1308, control signals on lines 1310, and data signals on lines 1306.

Memory device 1304 includes a DLL 1301 and a DLL controller 1303. DLL 1301 is shown as DLLs 101, 201, 700 and 900 in FIGS. 1, 2, 7 and 9. DLL Controller 1303 is shown as DLL controller 111, 222, 444 and 666 in FIG. 1, 2, 4 and 6. According to the invention, during a memory operation, processor 1302 provides certain combination of input signals and address signals to memory device 1304 via lines 1308 and lines 1310. The input signals are similar to the RAS*, CAS*, WE*, CS* signals shown in FIG. 1. Thus, a certain combination of the input signals causes memory device 1304 to operate in a certain mode such as the ACTIVE mode. According to the invention, in the ACTIVE mode, DLL controller 1303 activates a DLL control signal to prevent DLL 1301 from performing a synchronization operation during the ACTIVE mode.

Conclusion

The present invention includes a memory device having a DLL controller to control a DLL during an operational mode of the memory device such as an ACTIVE mode, a READ mode, or a REFRESH mode. During the operational mode, the DLL controller activates a DLL control signal to prevent the DLL from performing a synchronization operation so that an unknown shifting condition of the DLL can be avoided to reduce the effect of a change in the operating condition of the memory device to the DLL during the operational mode.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device comprising:
    a delay locked loop (DLL) for generating an internal clock signal based on an external clock signal, the DLL keeping the external and internal clock signals synchronized by performing a synchronization operation; and
    a DLL controller connected to the DLL for activating a DLL control signal during an operational mode of the memory device to prevent the DLL from performing the synchronization operation during the operational mode.

2. The memory device of claim 1 further comprising a plurality of memory cells for storing data.

3. The memory device of claim 2, wherein the operational mode is an active mode in which the memory cells are activated in preparation for subsequent access to the memory cells.

4. The memory device of claim 2, wherein the operational mode is a read mode in which the memory cells are accessed for reading the data stored in the memory cells.

5. The memory device of claim 2, wherein the operational mode is a refresh mode in which the data in the memory cells are refreshed to ensure the memory cells retain valid data values.

6. The memory device of claim 1, wherein the DLL includes:
    a phase detector for comparing the external and internal clock signals to activate a shifting signal when the external and internal clock signals are not synchronized; and
    a shift register for performing a shifting operation based on the shifting signal to keep the external and internal clock signals synchronized.

7. The memory device of claim 6, wherein the DLL controller includes:
  a plurality of input logic circuits for receiving a plurality of input signals to provide a plurality of output signals; and
  an output logic circuit for receiving the output signals to activate a DLL control signal to disable the shifting operation during the operational mode.

8. A memory device comprising:
  a delay locked loop (DLL) for applying a delay to an external clock signal to generate an internal clock signal, the DLL adjusting the delay to keep the external and internal clock signals synchronized; and
  a DLL controller for activating a DLL control signal during an operational mode of the memory device to prevent the DLL from adjusting the delay during the operational mode.

9. The memory device of claim 8 further comprising a plurality of memory cells, wherein the operational mode is an active mode in which the memory cells are activated in preparation for subsequent access to the memory cells.

10. The memory device of claim 8 further comprising a plurality of memory cells, wherein the operational mode is a read mode in which the memory cells are accessed for reading data stored in the memory cells.

11. The memory device of claim 8 further comprising a plurality of memory cells, wherein the operational mode is a refresh mode in which data stored in the memory cells are refreshed to ensure the memory cells retain valid data values.

12. The memory device of claim 8, wherein the DLL includes:
  a phase detector for comparing the external and internal clock signals to activate a shifting signal when the external and internal clock signals are not synchronized; and
  a shift register for adjusting the delay based on the shifting signal to keep the external and internal clock signals synchronized.

13. The memory device of claim 12, wherein the DLL controller includes:
  a plurality of input logic circuits for receiving a plurality of input signals to provide a plurality of output signals; and
  an output logic circuit for receiving the output signals to activate a DLL control signal to disable the shifting operation during the operational mode.

14. A memory device comprising:
  a delay locked loop (DLL) for applying a delay to an external clock signal to generate an internal clock signal, the DLL adjusting the delay to keep the external and internal clock signals synchronized; and
  a DLL controller for activating a DLL control signal during an active mode of the memory device to prevent the DLL from adjusting the delay during the active mode.

15. The memory device of claim 14 further comprising a plurality of memory cells arranged in rows and columns.

16. The memory device of claim 15, wherein in the active mode, a row of the memory cells is activated in preparation for subsequent access to the memory cells.

17. The memory device of claim 15, wherein in the active mode, a column of the memory cells is activated in preparation for subsequent access to the memory cells.

18. The memory device of claim 14, wherein the DLL includes:
  a phase detector for comparing the external and internal clock signal to activate a shifting signal when the external and internal clock signals are not synchronized; and
  a shift register for adjusting the delay based on the shifting signal to keep the external and internal clock signals synchronized.

19. The memory device of claim 18, wherein the DLL further includes a plurality of delay cells, wherein the delay applied to the external clock signal is equal to a delay of one delay cell multiplied by a number of delay cells being used.

20. The memory device of claim 18, wherein the DLL controller includes:
  a plurality of input logic circuits for receiving a plurality of input signals to provide a plurality of output signals; and
  an output logic circuit for receiving the output signals to activate a DLL control signal to disable the shifting operation during the active mode.

21. A memory device comprising:
  a plurality of inputs for receiving a plurality of input signals and an external clock signal;
  a delay locked loop (DLL) for generating an internal clock signal based on the external clock signal, the DLL performing a shifting operation to keep the external and internal clock signals synchronized;
  a decode circuit for activating an active signal based on certain combination of the input signals to initiate an active mode of the memory device; and
  a DLL controller for activating a DLL control signal to disable the shifting operation during the active mode.

22. The memory device of claim 21 further comprising a plurality of memory cells, wherein in the active mode, the memory cells are being activated for subsequent access to the memory cells.

23. The memory device of claim 21, wherein the DLL includes a delay line having a plurality of delay stages connected in series, wherein a number of the delay stages applies an amount of delay to the external clock signal to generate the internal clock signal.

24. The memory device of claim 22, wherein the DLL further includes:
  a phase detector for comparing the external and internal clock signals to activate a shifting signal when the external and internal clock signals are not synchronized; and
  a shift register for adjusting the amount of delay based on the shifting signal to keep the external and internal clock signals synchronized.

25. The memory device of claim 21, wherein the DLL controller includes:
  a first input for receiving a bank active signal, the bank active signal indicating whether a memory cell of the memory device is being activated during the active mode;
  a second input for receiving a sense amplifier enable signal, the sense amplifier enable signal activating a sense amplifier of the memory device during the active mode; and
  an output for providing the DLL control signal based on the bank active signal and the sense amplifier enable signal during the active mode.

26. The memory device of claim 25, wherein the DLL control signal is activated when the bank active signal is activated.

27. The memory device of claim 26, wherein DLL control signal is deactivated after the sense amplifier enable signal is activated for a predetermined time.

28. The memory device of claim 27, wherein the predetermined time is in the range of 10 to 15 nanoseconds.

29. The memory device of claim 26, wherein the DLL control signal is deactivated when the memory device restores its supply voltage to a voltage level existing before the active mode was activated.

30. A memory device comprising:
   a plurality of inputs for receiving a plurality of input signals and an external clock signal;
   a delay locked loop (DLL) for generating an internal clock signal based on the external clock signal, the DLL performing a shifting operation to keep the external and internal clock signals synchronized;
   a decode circuit for activating an read signal based on certain combination of the input signals to initiate a read mode of the memory device; and
   a DLL controller for activating a DLL control signal during a read mode to disable the shifting operation during the read mode.

31. The memory device of claim 30 further comprising a plurality of memory cells, wherein in the read mode, the memory cells are being accessed for reading data stored in the memory cells.

32. The memory device of claim 30, wherein the DLL includes:
   a delay line for applying an amount of delay to the external clock signal to generate the internal clock signal;
   a phase detector for comparing the external and internal clock signals to activate a shifting signal when the external and internal clock signals are not synchronized; and
   a shift register for adjusting the amount of delay based on the shifting signal to keep the external and internal clock signals synchronized.

33. The memory device of claim 30, wherein the DLL controller includes:
   a first input for receiving a bank active signal, the bank active signal indicating whether a memory cell of the memory device is being activated during an active mode;
   a second input for receiving a sense amplifier enable signal, the sense amplifier enable signal activating a sense amplifier of the memory device during the active mode;
   a third input for receiving the read signal; and
   an output for providing the DLL control signal based on the bank active signal, the sense amplifier enable signal, and the read signal during the read mode.

34. The memory device of claim 33, wherein the DLL control signal is activated when the read signal is activated.

35. The memory device of claim 34, wherein the DLL control signal is deactivated when the memory device restores its supply voltage to a voltage level existing before the read mode was activated.

36. A memory device comprising:
   a plurality of inputs for receiving a plurality of input signals and an external clock signal;
   a delay locked loop (DLL) for generating an internal clock signal based on the external clock signal, the DLL performing shifting operation to keep the external and internal clock signals synchronized;
   a decode circuit for activating a refresh signal based on certain combination of the input signals to initiate a refresh mode of the memory device; and
   a DLL controller for activating an output signal during the refresh mode to disable the shifting operation during the refresh mode.

37. The memory device of claim 36 further comprising a plurality of memory cells, wherein during the refresh mode, data stored in the memory cells are refreshed to ensure the memory cells retain valid data values.

38. The memory device of claim 36, wherein the DLL includes:
   a delay line for applying an amount of delay to the external clock signal to generate the internal clock signal;
   a phase detector for comparing the external and internal clock signals to activate a shifting signal when the external and internal clock signals are not synchronized; and
   a shift register for adjusting the amount of delay based on the shifting signal to keep the external and internal clock signals synchronized.

39. The memory device of claim 36, wherein the DLL controller includes:
   a first input for receiving a bank active signal, the bank active signal indicating whether a memory cell of the memory device is being activated during the active mode;
   a second input for receiving a sense amplifier enable signal, the sense amplifier enable signal activating a sense amplifier of the memory device during the active mode;
   a third input for receiving the refresh mode signal; and
   an output for providing the DLL control signal based on the bank active signal, the sense amplifier enable signal, and the refresh signal during the refresh mode.

40. The memory device of claim 39, wherein the DLL control signal is activated when the refresh signal is activated.

41. The memory device of claim 40, wherein the DLL control signal is deactivated when the memory device restores its supply voltage to the voltage level existing before the refresh mode was activated.

42. A memory device comprising:
   a plurality of memory banks;
   a plurality of inputs for receiving a plurality of input signals and an external clock signal;
   a delay locked loop (DLL) for generating an internal clock signal based on the external clock signal, the DLL performing shifting operation to keep the external and internal clock signals synchronized;
   a decode circuit for activating an active signal based on certain combination of the input signals to initiate an active mode of the memory device; and
   a DLL controller for activating a DLL control signal to disable the shifting operation during the active mode.

43. The memory device of claim 42, wherein the DLL includes:
   a delay line for applying an amount of delay to the external clock signal to generate the internal clock signal;
   a phase detector for comparing the external and internal clock signals to activate a shifting signal when the external and internal clock signals are not synchronized; and a shift register for adjusting the amount of delay based on the shifting signal to keep the external and internal clock signals synchronized.

44. The memory device of claim 42, wherein the DLL controller includes:
a plurality of inputs for receiving a plurality of bank active signals, the bank active signals indicates whether a memory bank is being accessed during the active mode;
a plurality of second inputs for receiving a plurality of sense amplifier enable signals, the sense amplifier enable signals activate sense amplifiers of the memory device during the active mode; and
an output for providing the DLL control signal based on the bank active signals and the sense amplifier enable signals.

45. The memory device of claim 44, wherein the DLL control signal is activated when at least one of the bank active signals is activated.

46. The memory device of claim 45, wherein the DLL control signal is deactivated after the last one of the sense amplifier enable signals is activated for a predetermined time.

47. The memory device of claim 46, wherein the predetermined time is in the range of 10 to 15 nanoseconds.

48. The memory device of claim 46, wherein the predetermined time is 12 nanoseconds.

49. The memory device of claim 45, wherein the DLL control signal is deactivated when the memory device restores its supply voltage to the voltage level existing before the active mode was activated.

50. A memory device comprising:
a delay line for applying an amount of delay to the external clock signal to generate the internal clock signal;
a phase detector for comparing the external and internal clock signals to activate a shifting signal when the external and internal clock signals are not synchronized;
a shift register for performing a shifting operation to adjust the amount of delay based on the shifting signal to keep the external and internal clock signals synchronized;
an input logic circuit for receiving first and second input signals and providing an output signal; and
an output logic circuit for receiving the output signal to activate a DLL control signal to disable the shifting operation during an active mode.

51. The memory device of claim 50, wherein the DLL control signal is activated when the first input signal is activated.

52. The memory device of claim 51, wherein DLL control signal is deactivated after the second input signal is activated for a predetermined time.

53. The memory device of claim 52, wherein the predetermined time is in the range of 10 to 15 nanoseconds.

54. The memory device of claim 50, wherein the phase detector includes:
input latches for receiving the external clock signal and a feedback signal to provide a first phase signal and a second phase signal, the feedback signal being a delayed version of the internal clock signal;
a logic circuit connected to the input latches to receive the second phase signals to generate pre-shifting signals;
output latches for activating shifting signals based on the pre-shifting signals when the external and internal clock signals are not synchronize; and a shifting signal control circuit for deactivating the shifting signal during the active mode.

55. A memory device comprising:
a decode circuit for receiving a plurality of input signals;
a plurality of banks of memory cells connected to the decode circuit;
a delay locked loop (DLL) controller connected to the banks of memory cells;
a DLL connected to the DLL controller for generating an internal clock signal based on an external clock signal, the DLL performing a synchronization operation to keep the external and internal clock signals synchronized; and
an output circuit for receiving the internal clock signal to output a data signal from the memory cells, wherein the DLL controller disables the synchronization operation during an operational mode of the memory device.

56. The memory device of claim 55, wherein the operational mode is an active mode, wherein the active mode is activated by a first combination of the input signals.

57. The memory device of claim 55, wherein the operational mode is a read mode, wherein the read mode is activated by a second combination of the input signals.

58. The memory device of claim 55, wherein the operational mode is a refresh mode, wherein the refresh mode is activated by a third combination of the input signals.

59. A system comprising:
a processor; and
a memory device connected to the processor, the memory device including:
a delay locked loop (DLL) for generating an internal clock signal based on an external clock signal, the DLL keeping the external and internal clock signals synchronized by performing a synchronization operation; and
a DLL controller connected to the DLL for activating a DLL control signal during an operational mode of the memory device to prevent the DLL from performing the synchronization operation during the operational mode.

60. The system of claim 59 further comprising a plurality of memory cells for storing data.

61. The system of claim 60, wherein the operational mode is an active mode in which the memory cells are activated in preparation for subsequent access to the memory cells.

62. The system of claim 60, wherein the operational mode is a read mode in which the memory cells are accessed for reading the data stored in the memory cells.

63. The system of claim 60, wherein the operational mode is a refresh mode in which the data in the memory cells are refreshed to ensure the memory cells retain valid data values.

64. The system of claim 59, wherein the DLL includes:
a phase detector for comparing the external and internal clock signals to activate a shifting signal when the external and internal clock signals are not synchronized; and
a shift register for performing a shifting operation based on the shifting signal to keep the external and internal clock signals synchronized.

65. The system of claim 64, wherein the DLL controller includes:
a plurality of input logic circuits for receiving a plurality of input signals to provide a plurality of output signals; and an output logic circuit for receiving the output signals to activate the DLL control signal to disable the shifting operation during the operational mode.

66. A system comprising:

a processor; and a memory device connected to the processor, the memory device including:

a delay locked loop (DLL) for applying a delay to an external clock signal to generate an internal clock signal, the DLL adjusting the delay to keep the external and internal clock signals synchronized; and a DLL controller for activating a DLL control signal during an active mode of the memory device to prevent the DLL from adjusting the delay during the active mode.

67. The system of claim 66 further comprising a plurality of memory cells arranged in rows and columns.

68. The system of claim 67, wherein in the active mode, a row of the memory cells is activated in preparation for subsequent access to the memory cells.

69. The system of claim 67, wherein in the active mode, a column of the memory cells is activated in preparation for subsequent access to the memory cells.

70. The system of claim 66, wherein the DLL includes:

a phase detector for comparing the external and internal clock signals to activate a shifting signal when the external and internal clock signals are not synchronized; and a shift register for adjusting the delay based on the shifting signal to keep the external and internal clock signals synchronized.

71. The system of claim 70, wherein the DLL further includes a plurality of delay cells, wherein the delay applied to the external clock signal is equal to a delay of one delay cell multiplied by a number of delay cells being used.

72. The system of claim 70, wherein the DLL controller includes:

a plurality of input logic circuits for receiving a plurality of input signals to provide a plurality of output signals; and an output logic circuit for receiving the output signals to activate the DLL control signal to disable the shifting operation during the active mode.

* * * * *

UNITED STATES PATENT AND TRADEMARK OFFICE
CERTIFICATE OF CORRECTION

| | | |
|---|---|---|
| PATENT NO. | : 7,245,540 B2 | Page 1 of 4 |
| APPLICATION NO. | : 09/874898 | |
| DATED | : July 17, 2007 | |
| INVENTOR(S) | : Jones et al. | |

It is certified that error appears in the above-identified patent and that said Letters Patent is hereby corrected as shown below:

Column 9, line 21 (Approx.), delete "it" and insert -- its --, therefor.

Column 16, line 59, in Claim 6, delete "The" and insert -- A --, therefor.

Column 16, lines 59–60, in Claim 6, delete "of claim 1, wherein the DLL includes:" and insert -- comprising:
      a delay locked loop (DLL) for generating an internal clock signal based on an external clock signal, the DLL keeping the external and internal clock signals synchronized by performing a synchronization operation, wherein the DLL includes --, therefor.

Column 16, line 64, in Claim 6, after "synchronized" delete ";" and insert -- , --, therefor.

Column 16, line 67, in Claim 6, after "synchronized" delete "." and insert -- ; and
      a DLL controller connected to the DLL for activating a DLL control signal during an operational mode of the memory device to prevent the DLL from performing the synchronization operation during the operational mode. --, therefor.

Column 17, line 33, in Claim 12, delete "The" and insert -- A --, therefor.

Column 17, lines 33–34, in Claim 12, delete "of claim 8, wherein the DLL includes:" and insert -- comprising:
      a delay locked loop (DLL) for applying a delay to an external clock signal to generate an internal clock signal, the DLL adjusting the delay to keep the external and internal clock signals synchronized, wherein the DLL includes --, therefor.

Column 17, line 38, in Claim 12, after "synchronized" delete ";" and insert -- , --, therefor.

Column 17, line 41, In Claim 12, after "synchronized" delete "." and insert -- ; and
      a DLL controller for activating a DLL control signal during an operational mode of the memory device to prevent the DLL from adjusting the delay during the operational mode. --. therefor.

Column 18, line 1, in Claim 18, delete "The" and insert -- A --, therefor.

UNITED STATES PATENT AND TRADEMARK OFFICE
CERTIFICATE OF CORRECTION

| | | |
|---|---|---|
| PATENT NO. | : 7,245,540 B2 | |
| APPLICATION NO. | : 09/874898 | |
| DATED | : July 17, 2007 | |
| INVENTOR(S) | : Jones et al. | |

It is certified that error appears in the above-identified patent and that said Letters Patent is hereby corrected as shown below:

Column 18, lines 1–2, in Claim 18, delete "of claim 14, wherein the DLL includes:" and insert -- comprising:
 a delay locked loop (DLL) for applying a delay to an external clock signal to generate an internal clock signal, the DLL adjusting the delay to keep the external and internal clock signals synchronized, wherein the DLL includes --, therefor.

Column 18, line 6, in Claim 18, after "synchronized" delete ";" and insert -- , --. therefor.

Column 18, line 9, in Claim 18, after "synchronized" delete "." and insert -- ; and
 a DLL controller for activating a DLL control signal during an active mode of the memory device to prevent the DLL from adjusting the delay during the active mode. --, therefor.

Column 18, line 29 (Approx.), in Claim 21, after "on" insert -- a --.

Column 19, line 17 (Approx.), in Claim 30, delete "an" and insert -- a --, therefor.

Column 19, line 17 (Approx.), in Claim 30, after "on" insert -- a --.

Column 20, line 1, in Claim 36, after "on" insert -- a --.

Column 20, line 54 (Approx.), in Claim 42, after "on" insert -- a --.

Column 21, line 63 (Approx.), in Claim 54, delete "to receive the" and insert -- for receiving the first and --, therefor.

Column 21, line 67, in Claim 54, delete "synchronize;" and insert -- synchronized; --, therefor.

Column 22, line 2, in Claim 54, delete "signal" and insert -- signals --, therefor.

Column 22, line 17, in Claim 55, delete "disables" and insert -- is adapted for disabling --, therefor.

Column 22, line 55 (Approx.), in Claim 64, delete "The" and insert -- A --, therefor.

UNITED STATES PATENT AND TRADEMARK OFFICE
CERTIFICATE OF CORRECTION

| | |
|---|---|
| PATENT NO. | : 7,245,540 B2 |
| APPLICATION NO. | : 09/874898 |
| DATED | : July 17, 2007 |
| INVENTOR(S) | : Jones et al. |

It is certified that error appears in the above-identified patent and that said Letters Patent is hereby corrected as shown below:

Column 22, line 55 (Approx.), in Claim 64, delete "of claim 59, wherein the DLL includes:" and insert -- comprising:
a processor; and
a memory device connected to the processor, the memory device including:
a delay locked loop (DLL) for generating an internal clock signal based on an external clock signal, the DLL keeping the external and internal clock signals synchronized by performing a synchronization operation, wherein the DLL includes --, therefor.

Column 22, line 59 (Approx.), in Claim 64, after "synchronized" delete ";" and insert -- , --, therefor.

Column 22, line 62, in Claim 64, after "synchronized" delete "." and insert -- ; and
    a DLL controller connected to the DLL for activating a DLL control signal during an operational mode of the memory device to prevent the DLL from performing the synchronization operation during the operational mode. --, therefor.

Column 23, line 18 (Approx.), in Claim 68, delete "The" and insert -- A --, therefor.

Column 23, line 18 (Approx.), in Claim 68, delete "of claim 67," and
insert -- comprising:
a processor; and
a memory device connected to the processor, the memory device including:
a plurality of memory cells arranged in rows and columns;
a delay locked loop (DLL) for applying a delay to an external clock signal to generate an internal clock signal, the DLL adjusting the delay to keep the external and internal clock signals synchronized; and a DLL controller for activating a DLL control signal during an active mode of the memory device to prevent the DLL from adjusting the delay during the active mode, --, therefor.

Column 23, line 21 (Approx.), in Claim 69, delete "The" and insert -- A --, therefor.

Column 23, line 21 (Approx.), in Claim 69, delete "of claim 67," and
insert -- comprising:
a processor; and
a memory device connected to the processor, the memory device including:
a plurality of memory cells arranged in rows and columns;
a delay locked loop (DLL) for applying a delay to an external clock signal to generate an internal dock signal, the DLL adjusting the delay to keep the external and internal clock signals synchronized; and
    a DLL controller for activating a DLL control signal during an active mode of the memory device to prevent the DLL from adjusting the delay during the active mode, --, therefor.

UNITED STATES PATENT AND TRADEMARK OFFICE
CERTIFICATE OF CORRECTION

PATENT NO. : 7,245,540 B2
APPLICATION NO. : 09/874898
DATED : July 17, 2007
INVENTOR(S) : Jones et al.

It is certified that error appears in the above-identified patent and that said Letters Patent is hereby corrected as shown below:

Column 24, line 1, in Claim 70, delete "The" and insert -- A --, therefor.

Column 24, line 1, in Claim 70, delete "of claim 66, wherein the DLL includes:" and insert -- comprising:
a processor; and
a memory device connected to the processor, the memory device including:
    a delay locked loop (DLL) for applying a delay to an external clock signal to generate an internal clock signal, the DLL adjusting the delay to keep the external and internal clock signals synchronized, wherein the DLL includes --, therefor.

Column 24, line 5 (Approx.), in Claim 70, after "synchronized" delete ";" and insert -- , --, therefor.

Column 24, line 9, in Claim 70, after "synchronized" delete "." and insert -- ; and
    a DLL controller for activating a DLL control signal during an active mode of the memory device to prevent the DLL from adjusting the delay during the active mode. --, therefor.

Signed and Sealed this

Sixth Day of November, 2007

JON W. DUDAS
*Director of the United States Patent and Trademark Office*